(12) United States Patent
Kim et al.

(10) Patent No.: US 11,425,833 B2
(45) Date of Patent: Aug. 23, 2022

(54) ELECTRONIC DEVICE INCLUDING FOLDABLE CONDUCTIVE PLATE

(71) Applicant: Samsung Electronics Co., Ltd., Suwon-si (KR)

(72) Inventors: Wooktae Kim, Suwon-si (KR); Gyuha Jo, Suwon-si (KR); Ingi Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/932,040

(22) Filed: Jul. 17, 2020

(65) Prior Publication Data
US 2021/0029841 A1  Jan. 28, 2021

(30) Foreign Application Priority Data

Jul. 26, 2019 (KR) ......................... 10-2019-0091295
Jul. 17, 2020 (KR) ......................... 10-2020-0088711

(51) Int. Cl.
*H05K 5/00* (2006.01)
*H05K 5/02* (2006.01)

(52) U.S. Cl.
CPC ......... *H05K 5/0247* (2013.01); *H05K 5/0017* (2013.01); *H05K 5/0226* (2013.01)

(58) Field of Classification Search
None
See application file for complete search history.

(56) References Cited

U.S. PATENT DOCUMENTS 7,232,313 B1 * 6/2007 Shinoda ................. H01R 35/02
439/31
10,227,808 B2 * 3/2019 Siddiqui ............... G06F 1/1641
(Continued)

FOREIGN PATENT DOCUMENTS

KR  10-2016-0101315 A   8/2016
KR  10-2016-0144912 A   12/2016
(Continued)

OTHER PUBLICATIONS

International Search Report dated Oct. 21, 2020, issued in International Application No. PCT/KR2020/009501.
(Continued)

*Primary Examiner* — Anthony Q Edwards
*Assistant Examiner* — Rashen E Morrison
(74) *Attorney, Agent, or Firm* — Jefferson IP Law, LLP

(57) ABSTRACT

An electronic device is provided. The electronic device includes a hinge, a first housing connected to the hinge, a second housing connected to the hinge so as to fold the first housing, and a display disposed to receive support of at least a portion of the second housing from at least a portion of the first housing through the hinge. The display includes a display panel, at least one polymer member disposed at a rear surface of the display panel, and a conductive plate disposed at a rear surface of the at least one polymer member. The conductive plate includes a first flat portion facing the first housing, a second flat portion facing the second housing, and a flexible portion configured to connect the first flat portion and the second flat portion and disposed to be bendable. The flexible portion includes support pieces spaced apart from each other through slits, and a conductive elastic member configured to connect electrically and physically the first flat portion, the support pieces, and the second flat portion.

20 Claims, 23 Drawing Sheets

(56) References Cited

U.S. PATENT DOCUMENTS

| | | | |
|---|---|---|---|
| 10,485,115 B1* | 11/2019 | Cromer | G06F 1/1683 |
| 10,490,771 B2 | 11/2019 | Kim et al. | |
| 10,798,836 B2* | 10/2020 | Manuel | E05F 1/12 |
| 2012/0120618 A1* | 5/2012 | Bohn | G06F 1/1618 |
| | | | 361/679.01 |
| 2014/0196254 A1 | 7/2014 | Song | |
| 2015/0055287 A1 | 2/2015 | Seo | |
| 2015/0089974 A1* | 4/2015 | Seo | A44C 5/08 |
| | | | 63/1.13 |
| 2016/0239133 A1* | 8/2016 | Ko | G06F 3/0448 |
| 2016/0357052 A1* | 12/2016 | Kim | G06F 1/1652 |
| 2017/0061836 A1* | 3/2017 | Kim | G06F 1/1626 |
| 2018/0059720 A1 | 3/2018 | Sun | |
| 2018/0097197 A1 | 4/2018 | Han et al. | |
| 2018/0294427 A1 | 10/2018 | Lee | |
| 2018/0324964 A1* | 11/2018 | Yoo | G06F 1/1652 |
| 2019/0036068 A1* | 1/2019 | Kim | G06F 1/1652 |
| 2019/0196548 A1* | 6/2019 | Kim | G09F 9/301 |
| 2019/0207141 A1 | 7/2019 | Kim et al. | |
| 2019/0261519 A1 | 8/2019 | Park et al. | |
| 2019/0317550 A1 | 10/2019 | Kim et al. | |
| 2020/0257335 A1* | 8/2020 | Kim | G06F 1/1616 |

FOREIGN PATENT DOCUMENTS

| | | |
|---|---|---|
| KR | 10-2018-0036857 A | 4/2018 |
| KR | 10-2018-0122210 A | 11/2018 |
| KR | 10-2019-0003257 A | 1/2019 |
| KR | 10-2019-9080740 A | 7/2019 |
| KR | 10-2266152 B1 | 6/2021 |

OTHER PUBLICATIONS

Extended European Search Report dated Jan. 12, 2021, in European Application No. 20187659.6.

European Notification of Patent Grant dated Jul. 5, 2022, issued in European Patent Application No. 20187659.6-1224.

* cited by examiner

ELECTRONIC DEVICE INCLUDING FOLDABLE CONDUCTIVE PLATE

CROSS-REFERENCE TO RELATED APPLICATION(S)

This application is based on and claims priority under 35 U.S.C. § 119 of a Korean patent application number 10-2019-0091295, filed on Jul. 26, 2019, in the Korean Intellectual Property Office, and of a Korean patent application number 10-2020-0088711, filed on Jul. 17, 2020, in the Korean Intellectual Property Office, the disclosure of each of which is incorporated by reference herein in its entirety.

BACKGROUND

1. Field

The disclosure relates to an electronic device including a foldable conductive plate.

2. Description of Related Art

As a functional gap of each manufacturer significantly reduces, electronic devices are gradually becoming slim to meet a consumer's purchasing needs, and in order to increase rigidity of the electronic devices, to strengthen design aspects thereof, and to simultaneously differentiate functional elements thereof, the electronic devices are improving. These electronic devices are gradually being transformed into various shapes by deviating from a uniform rectangular shape. For example, while the electronic device is convenient to carry, the electronic device may have a transformable structure capable of using a large screen display when used. As a kind of the electronic device, a foldable type electronic device has been continuously released, and an improved support structure for a foldable display may be requested.

A foldable electronic device may include a hinge structure and a first housing structure and a second housing structure connected in directions opposite to each other in the hinge structure. The foldable electronic device may operate in an in-folding method and/or an out-folding method by rotating the first housing structure in a range of 0° to 360° with respect to the second housing structure through the hinge structure. The foldable electronic device may include a flexible display disposed to cross the first housing structure and the second housing structure in an open state of 180°.

In general, an electronic device having a single housing (e.g., bar type electronic device) may include at least one conductive plate disposed at a rear surface of a display in an internal space, and capable of assisting in reinforcing rigidity by supporting the display, and provided for the purpose of shielding noise. The conductive plate may be grounded to the ground of a printed circuit board disposed inside the electronic device through an electrical connection member.

The foldable electronic device may have a configuration in which the first housing structure and the second housing structure move relative to each other by the hinge structure, thereby being separated from each other. Accordingly, in the case of a conductive plate that cannot be folded, the conductive plate may be disposed separately in two conductive plates in each housing structure.

However, a separate disposition structure of the conductive plate may enable foreign materials to introduce from the outside between the conductive plates according to a folding operation of the electronic device, and the introduced foreign material may damage the display at a rear surface of the display and cause a display defect in which visibility is deteriorated. Further, the separate disposition structure of the conductive plate may cause a folding mark at a corresponding portion of the display facing an edge portion of each conductive plate near the hinge structure by a frequent folding operation of the electronic device, and such a folding mark may cause a malfunction of the electronic device and deteriorate operational reliability.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a foldable conductive plate.

Another aspect of the disclosure is to provide an electronic device including a foldable conductive plate that can help improve reliability of a display by preventing a foreign material from entering according to a folding operation.

Another aspect of the disclosure is to provide an electronic device including a foldable conductive plate that can adjust flexibility in each area according to folding characteristics.

Another aspect of the disclosure is to provide an electronic device including a foldable conductive plate having a reduced production cost and excellent assembly.

Additional aspects will be set forth in part in the description which follows and, in part, will be apparent from the description, or may be learned by practice of the presented embodiments.

In accordance with an aspect of the disclosure, an electronic device is provided. The electronic device includes a hinge, a first housing connected to the hinge, a second housing connected to the hinge so as to fold the first housing, and a display disposed to receive support of at least a portion of the second housing from at least a portion of the first housing through the hinge, wherein the display includes a display panel, at least one polymer member disposed at a rear surface of the display panel, and a conductive plate disposed at a rear surface of the at least one polymer member, wherein the conductive plate includes a first flat portion facing the first housing, a second flat portion facing the second housing, and a flexible portion configured to connect the first flat portion and the second flat portion and disposed to be bendable, and wherein the flexible portion includes a plurality of support pieces spaced apart from each other through a plurality of slits, and a conductive elastic member configured to connect electrically and physically the first flat portion, the plurality of support pieces, and the second flat portion.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
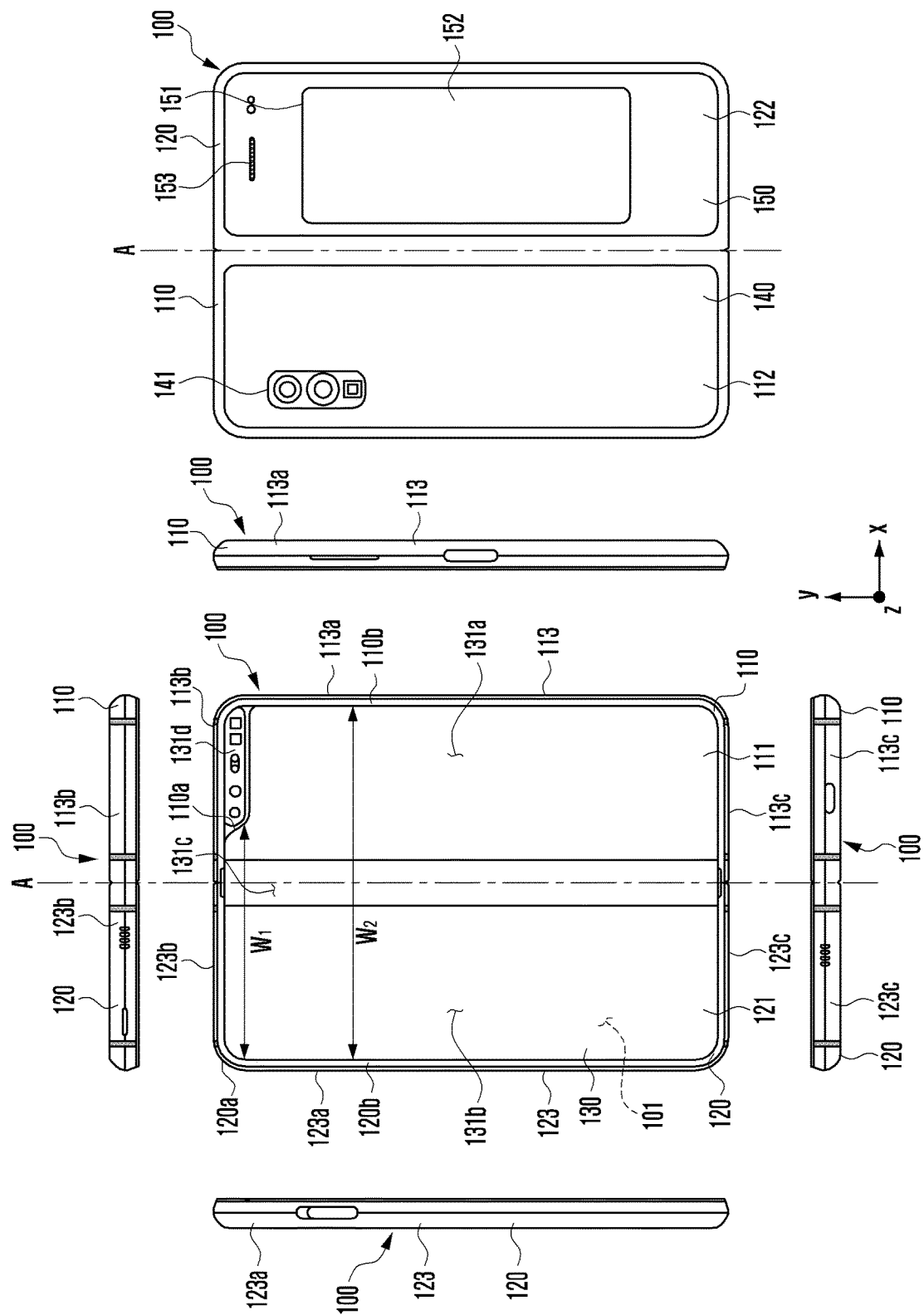
FIG. 1 is a diagram illustrating an unfolded state of an electronic device according to an embodiment of the disclosure.

FIG. 1 is a diagram illustrating an unfolded state of an electronic device according to an embodiment of the disclosure.

Referring to FIG. 1, an electronic device 100 may include a pair of housing structures 110 and 120 rotatably coupled via a hinge structure (e.g., hinge structure 164 in FIG. 3) to be folded relative to each other, a hinge cover 165 covering the foldable portion of the pair of housing structures 110 and 120, and a display 130 (e.g., flexible display or foldable display) disposed in the space formed by the pair of housing structures 110 and 120. In the description, the surface on which the display 130 is disposed may be referred to as the front surface of the electronic device 100, and the opposite side of the front surface may be referred to as the rear surface of the electronic device 100. The surface surrounding the space between the front surface and the rear surface may be referred to as the side surface of the electronic device 100.

In one embodiment, the pair of housing structures 110 and 120 may include a first housing structure 110 including a sensor region 131d, a second housing structure 120, a first rear cover 140, and a second rear cover 150. The pair of housing structures 110 and 120 of the electronic device 100 are not limited to the shape or combination illustrated in FIGS. 1 and 2, but may be implemented in various shapes or combinations. For example, in another embodiment, the first housing structure 110 and the first rear cover 140 may be formed as a single body, and the second housing structure 120 and the second rear cover 150 may be formed as a single body.

In one embodiment, the first housing structure 110 and the second housing structure 120 may be disposed at both sides with respect to the folding axis (A) and may be substantially symmetrical with respect to the folding axis (A). In one embodiment, the angle or distance between the first housing structure 110 and the second housing structure 120 may vary depending upon whether the electronic device 100 is in the flat state or closed state, the folded state, or the intermediate state. In one embodiment, the first housing structure 110 includes the sensor region 131d where various sensors are disposed, but may have a symmetrical shape with the second housing structure 120 in other regions. In another embodiment, the sensor region 131d may be disposed in a specific region of the second housing structure 120 or may be replaced.

In one embodiment, during the flat state of the electronic device 100, the first housing structure 110 may be connected to the hinge structure (e.g., hinge structure 164 in FIG. 3), and may include a first surface 111 facing the front surface of the electronic device 100, a second surface 112 facing away from the first surface 111, and a first side member 113 enclosing at least a portion of the space between the first surface 111 and the second surface 112. In one embodiment, the first side member 113 may include a first side surface 113a disposed in parallel with the folding axis (A), a second side surface 113b extending from one end of the first side surface 113a in a direction perpendicular to the folding axis, and a third side surface 113c extending from the other end of the first side surface 113a in a direction perpendicular to the folding axis.

In one embodiment, during the flat state of the electronic device 100, the second housing structure 120 may be connected to the hinge structure (e.g., hinge structure 164 in FIG. 3), and may include a third surface 121 facing the front surface of the electronic device 100, a fourth surface 122 facing away from the third surface 121, and a second side member 123 enclosing at least a portion of the space between the third surface 121 and the fourth surface 122. In one embodiment, the second side member 123 may include a fourth side surface 123a disposed in parallel with the folding axis (A), a fifth side surface 123b extending from one end of the fourth side surface 123a in a direction perpendicular to the folding axis, and a sixth side surface 123c extending from the other end of the fourth side surface 123a in a direction perpendicular to the folding axis. In one embodiment, the third surface 121 may face the first surface 111 in the folded state.

In one embodiment, the electronic device 100 may include a recess 101 formed to accommodate the display 130 through a structural combination of the shapes of the first housing structure 110 and the second housing structure 120. The recess 101 may have substantially the same size as the display 130. In one embodiment, the recess 101 may have two or more different widths in a direction perpendicular to the folding axis (A) due to the sensor region 131d. For example, the recess 101 may have a first width (W1) between a first portion 120a of the second housing structure 120 parallel to the folding axis (A) and a first portion 110a of the first housing structure 110 formed at the edge of the sensor region 131d, and have a second width (W2) between a second portion 120b of the second housing structure 120 and a second portion 110b of the first housing structure 110 that does not correspond to the sensor region 113d and is parallel to the folding axis (A). Here, the second width (W2) may be wider than the first width (W1). In other words, the recess 101 may be formed to have the first width (W1) ranging from the first portion 110a of the first housing structure 110 to the first portion 120a of the second housing structure 120 (asymmetric shape), and the second width (W2) ranging from the second portion 110b of the first housing structure 110 to the second portion 120b of the second housing structure 120 (symmetric shape). In one embodiment, the first portion 110a and the second portion 110b of the first housing structure 110 may be located at different distances from the folding axis (A). The width of the recess 101 is not limited to the example shown above. In various embodiments, the recess 101 may have two or more different widths owing to the shape of the sensor region 113d or the asymmetry of the first housing structure 110 or the second housing structure 120.

In one embodiment, at least a portion of the first housing structure 110 and the second housing structure 120 may be made of a metal or non-metal material having a rigidity value selected to support the display 130.

In one embodiment, the sensor region 131d may be formed to have a preset area near to one corner of the first housing structure 110. However, the arrangement, shape, or size of the sensor region 131d is not limited to the illustrated example. For example, in a certain embodiment, the sensor region 131d may be formed at another corner of the first housing structure 110 or in any region between the upper corner and the lower corner. In another embodiment, the sensor region 131d may be disposed at a portion of the second housing structure 120. In another embodiment, the sensor region 131d may be formed to extend between the first housing structure 110 and the second housing structure 120. In one embodiment, to perform various functions, the electronic device 100 may include components exposed to the front surface of the electronic device 100 through the sensor region 113d or through one or more openings provided in the sensor region 131d. The components may include, for example, at least one of a front camera, a receiver, a proximity sensor, an illuminance sensor, an iris recognition sensor, an ultrasonic sensor, or an indicator.

In one embodiment, the first rear cover 140 may be disposed on the second surface 112 of the first housing structure 110 and may have a substantially rectangular periphery. In one embodiment, at least a portion of the periphery may be wrapped by the first housing structure 110. Similarly, the second rear cover 150 may be disposed on the fourth surface 122 of the second housing structure 120, and at least a portion of the periphery thereof may be wrapped by the second housing structure 120.

In the illustrated embodiment, the first rear cover 140 and the second rear cover 150 may have a substantially symmetrical shape with respect to the folding axis (A). In another embodiment, the first rear cover 140 and the second rear cover 150 may have various different shapes. In another embodiment, the first rear cover 140 may be formed as a single body with the first housing structure 110, and the second rear cover 150 may be formed as a single body with the second housing structure 120.

In one embodiment, the first rear cover 140, the second rear cover 150, the first housing structure 110, and the second housing structure 120 may be combined with each other so as to provide a space where various components (e.g., printed circuit board, antenna module, sensor module, and battery) of the electronic device 100 can be arranged. In one embodiment, one or more components may be disposed on or visually exposed via the rear surface of the electronic device 100. For example, one or more components or sensors may be visually exposed through the first rear region 141 of the first rear cover 140. The sensors may include a proximity sensor, a rear camera, and/or a flash. In another embodiment, at least a portion of the sub-display 152 may be visually exposed through the second rear region 151 of the second rear cover 150.

The display 130 may be disposed on the space formed by the pair of housing structures 110 and 120. For example, the display 130 may be seated in the recess (e.g., recess 101 in FIG. 1) formed by the pair of housing structures 110 and 120, and may be disposed to substantially occupy most of the front surface of the electronic device 100. Hence, the front surface of the electronic device 100 may include the display 130, a portion (e.g., edge region) of the first housing structure 110 close to the display 130, and a portion (e.g. edge region) of the second housing structure 120 close to the display 130. In one embodiment, the rear surface of the electronic device 100 may include the first rear cover 140, a portion (e.g., edge region) of the first housing structure 110 close to the first rear cover 140, the second rear cover 150, and a portion (e.g. edge region) of the second housing structure 120 close to the second rear cover 150.

In one embodiment, the display 130 may refer to a display in which at least a portion may be deformed into a flat or curved surface. In one embodiment, the display 130 may include a folding region 131c, a first region 131a disposed on one side (e.g., right side of the folding region 131c) with respect to the folding region 131c, and a second region 131b disposed on the other side (e.g., left side of the folding region 131c). For example, the first region 131a may be disposed on the first surface 111 of the first housing structure 110, and the second region 131b may be disposed on the third surface 121 of the second housing structure 120. This demarcation of the display 130 is only an example, and the display 130 may be subdivided into plural regions (e.g., four or more regions) according to the structure or functionality. For example, in the embodiment of FIG. 1, the area of the display 130 may be subdivided with respect to the folding region 131c or the folding axis (A) extending parallel to the y-axis. However, in another embodiment, the area of the display 130 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 110 and 120 and the hinge structure (e.g., hinge structure 164 in FIG. 3), and the display 130 may substantially present one full screen through the pair of housing structures 110 and 120 and the hinge structure (e.g., hinge structure 164 in FIG. 3). In one embodiment, the first region 131a and the second region 131b may have a symmetrical shape with respect to the folding region 131c. Although the first region 131a may include a notch region (e.g., notch region 133 in FIG. 3) cut according to the presence of the sensor region 131d, the first region 131a may have a symmetrical shape with the second region 131b in other portions. In other words, the first region 131a and the second region 131b may include portions with symmetrical shapes and portions with asymmetrical shapes.

Figure 2:
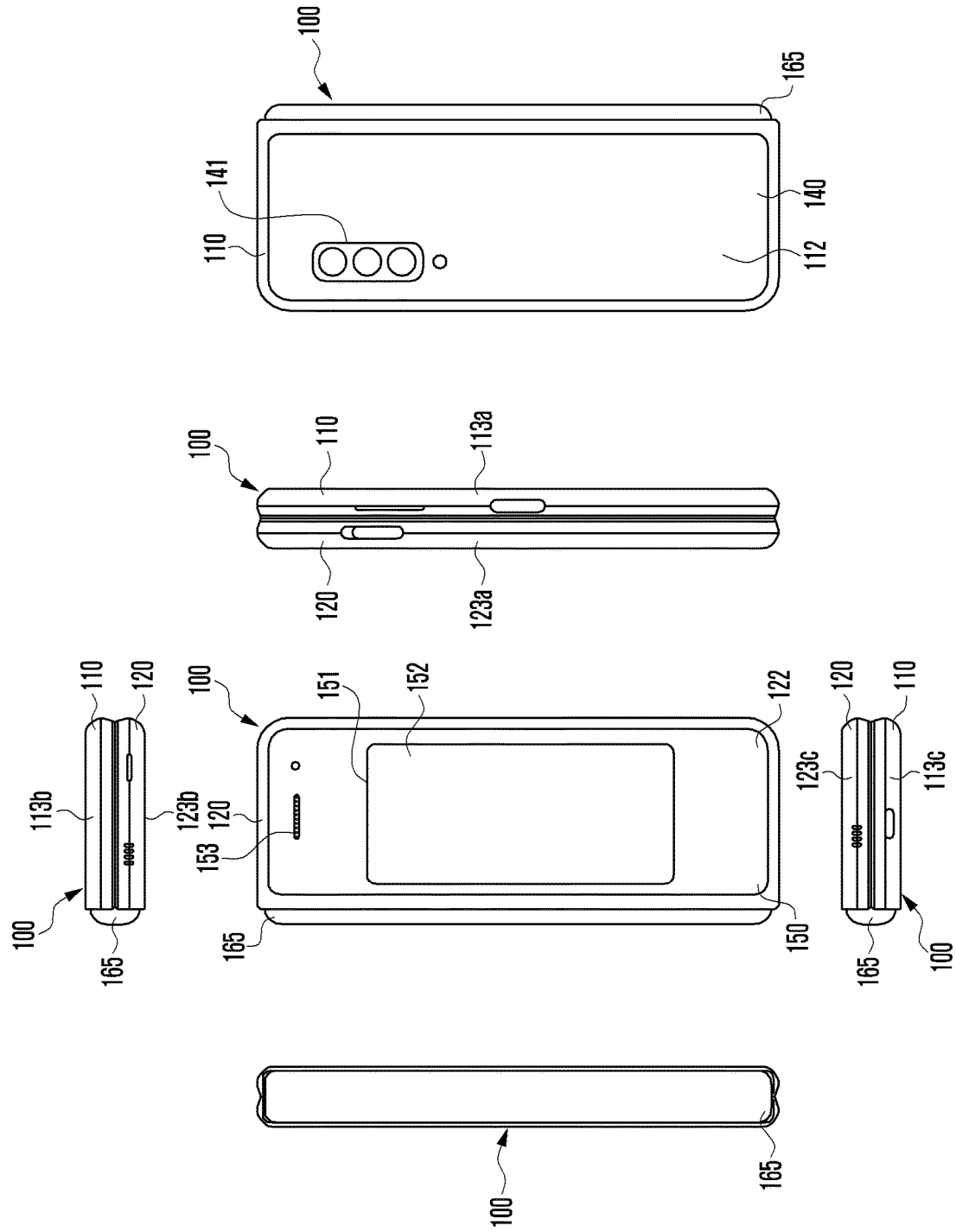
FIG. 2 is a diagram illustrating a folded state of the electronic device of FIG. 1 according to an embodiment of the disclosure.

FIG. 2 is a diagram illustrating a folded state of the electronic device of FIG. 1 according to an embodiment of the disclosure.

Figure 3:
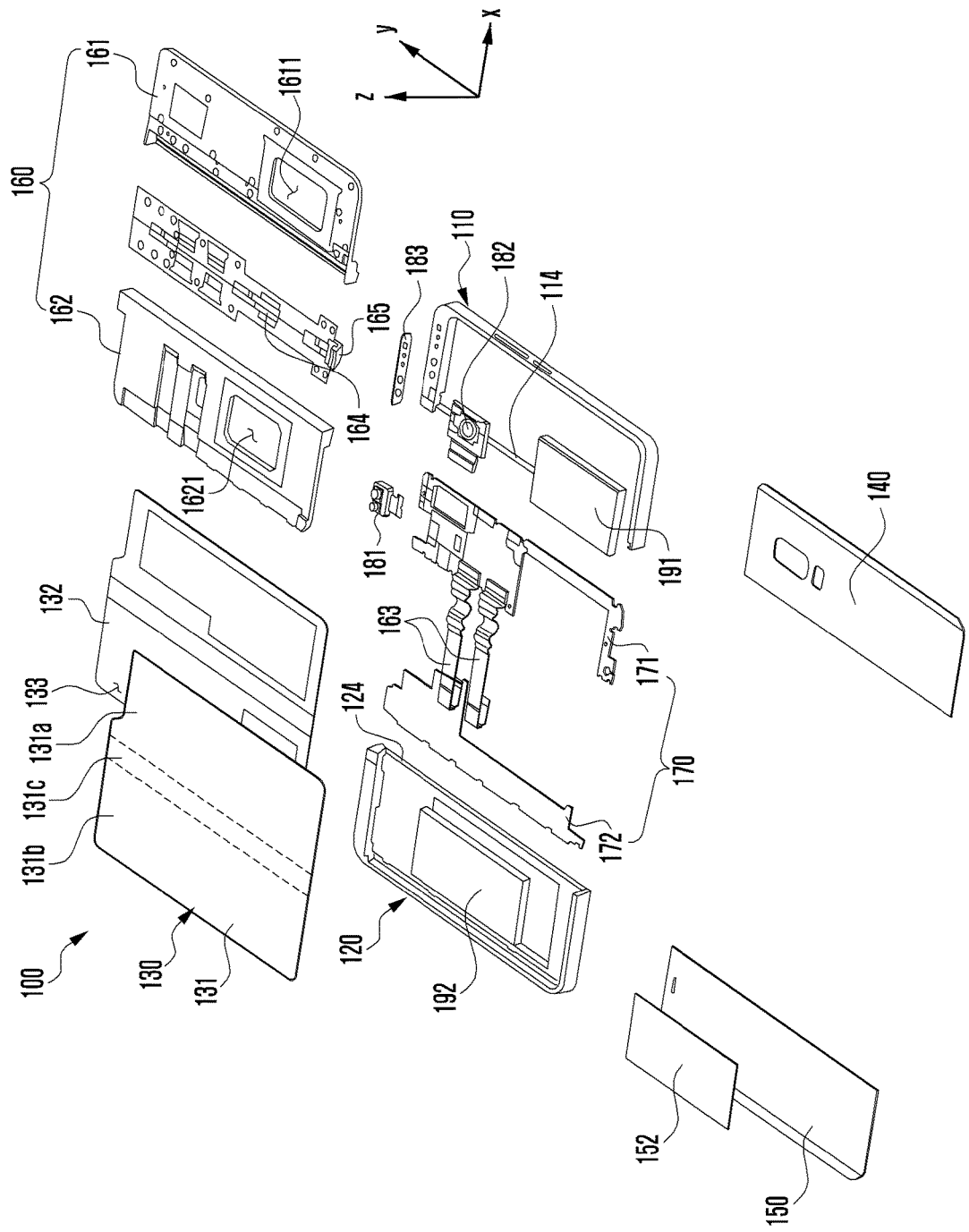
FIG. 3 is an exploded perspective view illustrating an electronic device according to an embodiment of the disclosure.

Referring to FIG. 2, the hinge cover 165 may be disposed between the first housing structure 110 and the second housing structure 120 so as to cover the internal components (e.g., hinge structure 164 in FIG. 3). In one embodiment, the hinge cover 165 may be covered by portions of the first housing structure 110 and the second housing structure 120 or be exposed to the outside according to the operating state (e.g., flat state or folded state) of the electronic device 100.

For example, when the electronic device 100 is in the flat state as illustrated in FIG. 1, the hinge cover 165 may be covered by the first housing structure 110 and the second housing structure 120 so as not to be exposed. When the electronic device 100 is in the folded state (e.g., completely folded state) as illustrated in FIG. 2, the hinge cover 165 may be exposed to the outside between the first housing structure 110 and the second housing structure 120. When the electronic device 100 is in the intermediate state where the first housing structure 110 and the second housing structure 120 make a certain angle, the hinge cover 165 may be partially exposed to the outside between the first housing structure 110 and the second housing structure 120. In this case, the exposed portion may be less than that for the fully folded state. In one embodiment, the hinge cover 165 may include a curved surface.

Next, a description is given of configurations of the first housing structure 110 and the second housing structure 120 and regions of the display 130 according to the operating state (e.g. flat state or folded state) of the electronic device 100.

In one embodiment, when the electronic device 100 is in the flat state (e.g., state of FIG. 1), the first housing structure 110 and the second housing structure 120 may make an angle of 180 degrees, and the first region 131a and the second region 131b of the display may be disposed to face in the same direction. In addition, the folding region 131c may be coplanar with the first region 131a and the second region 131b.

In one embodiment, when the electronic device 100 is in the folded state (e.g., state of FIG. 2), the first housing structure 110 and the second housing structure 120 may be disposed to face each other. The first region 131a and the second region 131b of the display 130 may face each other, making a narrow angle (e.g., between 0 degrees and 10 degrees). At least a portion of the folding region 131c may form a curved surface with a preset curvature.

In one embodiment, when the electronic device 100 is in the intermediate state, the first housing structure 110 and the second housing structure 120 may be disposed to make a certain angle. The first region 131a and the second region 131b of the display 130 may form an angle greater than that for the folded state and less than that for the flat state. At least a portion of the folding region 131c may form a curved surface with a preset curvature. This curvature may be less than that for the folded state.

FIG. 3 is an exploded perspective view of an electronic device according to an embodiment of the disclosure.

Referring to FIG. 3, in one embodiment, the electronic device 100 may include a display 130, a support member assembly 160, at least one printed circuit board 170, a first housing structure 110, a second housing structure 120, a first rear cover 140, and a second rear cover 150. In the description, the display 130 may be referred to as a display unit, display module, or display assembly.

The display 130 may include a display panel 131 (e.g., flexible display panel), and at least one plate 132 or layer on which the display panel 131 is seated. In one embodiment, one or more plates 132 may include a conductive plate (e.g., Cu sheet or SUS sheet) disposed between the display panel 131 and the support member assembly 160. According to one embodiment, the conductive plate may be formed to have substantially the same area as that of the display, and an area facing a folding area of the display may be formed to be bendable. The plate 132 may include at least one subsidiary material layer (e.g., graphite member) disposed at a rear surface of the display panel 131. In one embodiment, the plate 132 may be formed in a shape corresponding to the display panel 131. For example, a partial area of the first plate 132 may be formed in a shape corresponding to the notch area 133 of the display panel 131.

The support member assembly 160 may include a first support member 161, a second support member 162, a hinge structure 164 disposed between the first support member 161 and the second support member 162, a hinge cover 165 to cover the hinge structure 164 when viewed from the outside, and a wiring member 163 (e.g., flexible printed circuit board (FPCB)) that crosses the first support member 161 and the second support member 162.

In one embodiment, the support member assembly 160 may be disposed between the plate 132 and at least one printed circuit board 170. For example, the first support member 161 may be disposed between the first region 131a of the display 130 and the first printed circuit board 171. The second support member 162 may be disposed between the second region 131b of the display 130 and the second printed circuit board 172.

In one embodiment, at least a portion of the wiring member 163 and the hinge structure 164 may be disposed within the support member assembly 160. The wiring member 163 may be disposed in a direction crossing the first support member 161 and the second support member 162 (e.g., x-axis direction). The wiring member 163 may be disposed in a direction (e.g., x-axis direction) perpendicular to the folding axis (e.g., y-axis or folding axis (A) in FIG. 2) of the folding region 131c.

The at least one printed circuit board 170 may include, as described above, the first printed circuit board 171 disposed on the side of the first support member 161, and the second printed circuit board 172 disposed on the side of the second support member 162. The first printed circuit board 171 and the second printed circuit board 172 may be disposed inside the space formed by the support member assembly 160, the first housing structure 110, the second housing structure 120, the first rear cover 140, and the second rear cover 150. Various components for implementing functions of the electronic device 100 may be mounted on the first printed circuit board 171 and the second printed circuit board 172.

In an embodiment, a first space of the first housing structure 110 may include a first printed circuit board 171 disposed in a space formed through the first support member 161, a first battery 191 disposed at a position facing a first swelling hole 1611 of the first support member 161, at least one sensor module 181, or at least one camera module 182. The first housing structure 110 may include a window glass 183 disposed to protect at least one sensor module 181 and at least one camera module 182 at a position corresponding to the notch area 133 of the display 130. In one embodiment, the second space of the second housing structure 120 may include a second printed circuit board 172 disposed in a second space formed through the second support member 162 and a second battery 192 disposed at a position facing the second swelling hole 1621 of the second support member 162. According to one embodiment, the first housing structure 110 and the first support member 161 may be integrally formed. According to one embodiment, the second housing structure 120 and the second support member 162 may also be integrally formed. According to an embodiment, a sub display 152 may be disposed in the second space of the second housing structure 120. According to an embodiment, the sub display 152 (e.g., the second display) may be disposed to be visible from the outside through at least a partial area of the second rear cover 150. In addition, a speaker and/or microphone 153 may also be visible, as illustrated in FIGS. 1 and 2.

In one embodiment, the first housing structure 110 may include a first rotary support surface 114, and the second housing structure 120 may include a second rotary support surface 124 corresponding to the first rotary support surface 114. The first rotary support surface 114 and the second rotary support surface 124 may include a curved surface corresponding to the curved surface included in the hinge cover 165.

In one embodiment, when the electronic device 100 is in the flat state (e.g., state of FIG. 1), the first rotary support surface 114 and the second rotary support surface 124 may cover the hinge cover 165 so that the hinge cover 165 may be not or minimally exposed to the rear surface of the electronic device 100. When the electronic device 100 is in the folded state (e.g., state of FIG. 2), the first rotary support surface 114 and the second rotary support surface 124 may rotate along the curved surface included in the hinge cover 165 so that the hinge cover 165 may be maximally exposed to the rear surface of the electronic device 100.

Figure 4A:
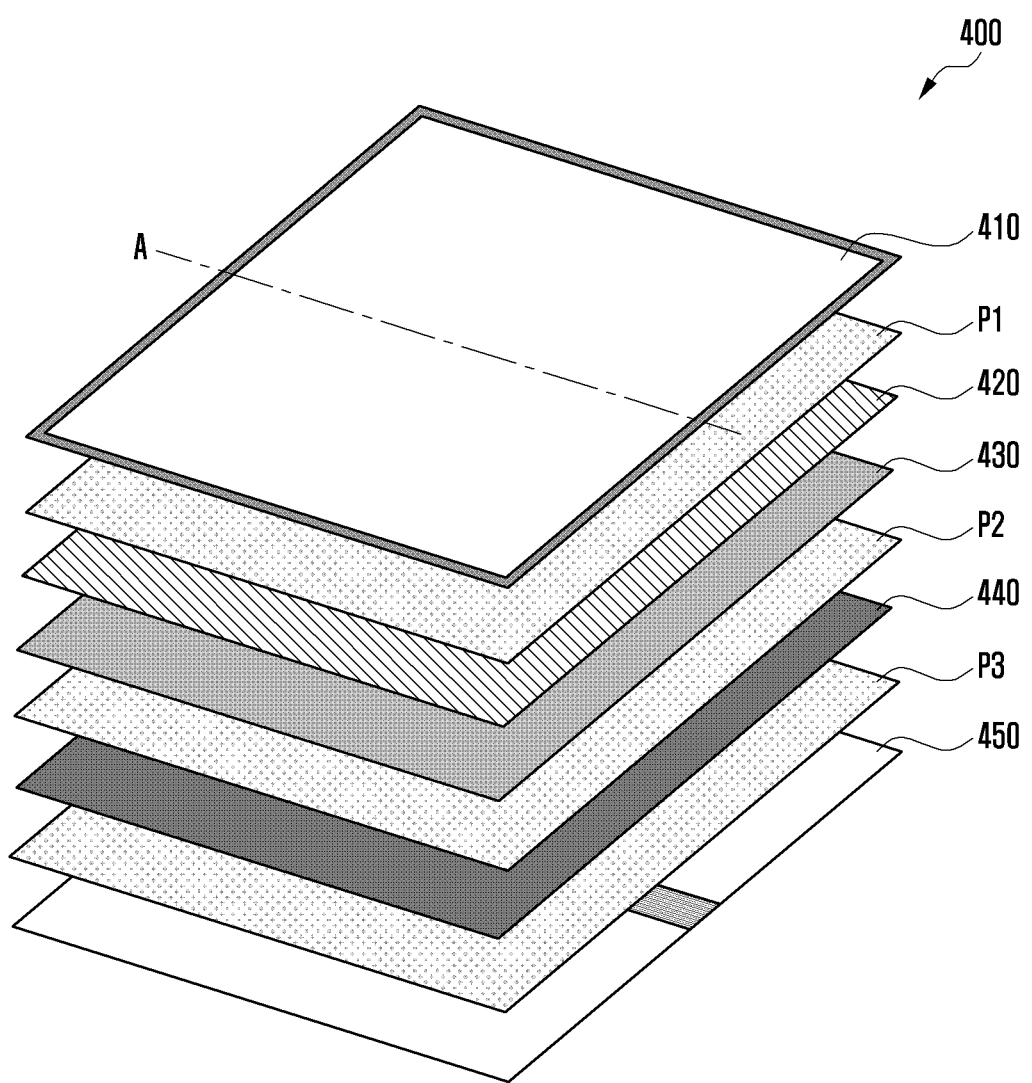
FIG. 4A is an exploded perspective view illustrating a stacked structure of a display according to an embodiment of the disclosure.

FIG. 4A is an exploded perspective view illustrating a stacked structure of a display 400 according to an embodiment of the disclosure.

Figure 4B:
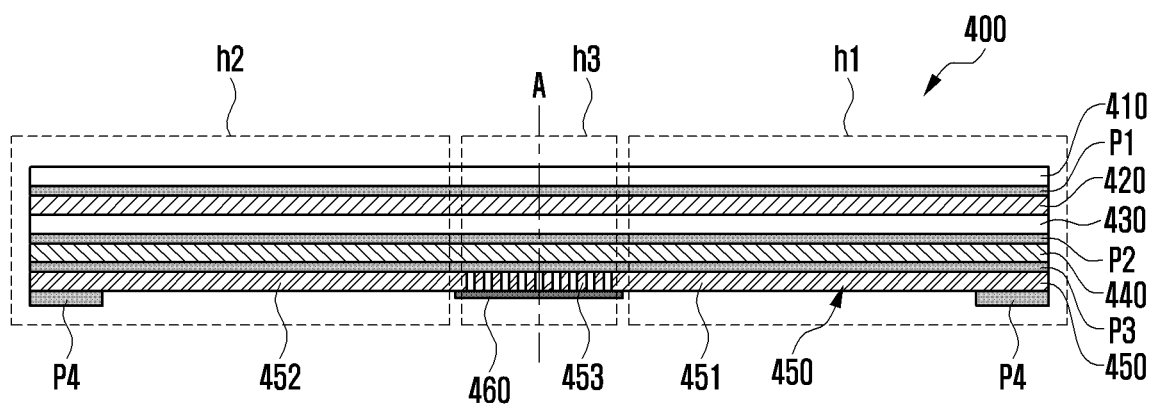
FIG. 4B is a cross-sectional view illustrating a stacked structure of a display according to an embodiment of the disclosure.

FIG. 4B is a cross-sectional view illustrating a stacked structure of a display 400 according to an embodiment of the disclosure.

The display 400 of FIGS. 4A and 4B may be at least partially similar to the display 130 of FIG. 3 or may further include other components of the display.

Referring to FIGS. 4A and 4B, the display 400 may include a window 410 (e.g., polyimide (PI) film or ultra-thin glass (UTG)), a polarizer (POL) 420 (e.g., polarizing film), a display panel 430, a polymer member 440, and a conductive plate 450 sequentially disposed at a rear surface of the window 410. According to one embodiment, the window 410, the POL 420, the display panel 430, the polymer member 440, and the conductive plate 450 may be disposed to cross at least a portion of a first surface (e.g., the first surface 111 of FIG. 1) of a first housing structure (e.g., the first housing structure 110 of FIG. 1) and a third surface (e.g., the third surface 121 of FIG. 1) of a second housing structure (e.g., the second housing structure 120 of FIG. 1). According to an embodiment, a first area h1, which is a planar area corresponding to the first housing structure 110 of the electronic device (e.g., the electronic device 100 of FIG. 1) and a second area h2, which is a planar area corresponding to the second housing structure 120 may be configured to be folded or unfolded based on a third area h3 (e.g., folding area) facing a hinge structure (e.g., the hinge structure 164 of FIG. 3) and including an area at least partially folded. According to one embodiment, the POL 420, the display panel 430, the polymer member 440, and the conductive plate 450 may be attached to each other through adhesive members P1, P2, and P3. For example, the adhesive members P1, P2, and P3 may include at least one of an optical clear adhesive (OCA), pressure sensitive adhesive (PSA), heat reactive adhesive, general adhesive, or double-sided tape. According to one embodiment, the display 400 may include another adhesive member P4 (e.g., double-sided tape or waterproof member) disposed along an edge at one surface of the conductive plate 450. According to one embodiment, the display 400 may be attached to a support member assembly (e.g., the support member assembly 160 of FIG. 3) of the electronic device (e.g., the electronic device 100 of FIG. 3) through another adhesive member P4.

According to various embodiments, the polymer member 440 may be formed with a dark color (e.g., black) to help display a background when the display is off. According to one embodiment, the polymer member 440 may act as a cushioning member for preventing the display 400 from being damaged by absorbing an impact from the outside of the electronic device. According to one embodiment, the conductive plate 450 may be formed with a metal sheet, which can help reinforce rigidity of the electronic device, shield ambient noise, and be used for dissipating a heat emitted from peripheral heat emitting components. According to one embodiment, the conductive plate 450 may include at least one of Cu, Al, SUS, or CLAD (e.g., a stacked member in which SUS and Al are alternately disposed). In another embodiment, the conductive plate 450 may include other alloy materials.

According to various embodiments, the display 400 may include at least one functional member disposed between the polymer member 440 and the conductive plate 450. According to one embodiment, the functional member may include a graphite sheet for heat dissipation, added display, force touch FPCB, fingerprint sensor FPCB, communication antenna radiator, heat dissipation sheet, conductive/non-conductive tape, or open cell sponge. According to one embodiment, when the functional member can be bent, the functional member may be disposed from the first housing structure (e.g., the first housing structure 110 of FIG. 3) to at least a portion of the second housing structure (e.g., the second housing structure 120 of FIG. 3) via the hinge structure (e.g., the hinge structure 164 of FIG. 3). In another embodiment, the display 400 may further include a detection member for detecting an input by an electromagnetic induction type writing member. According to one embodiment, the detection member may include a digitizer.

Figure 4C:
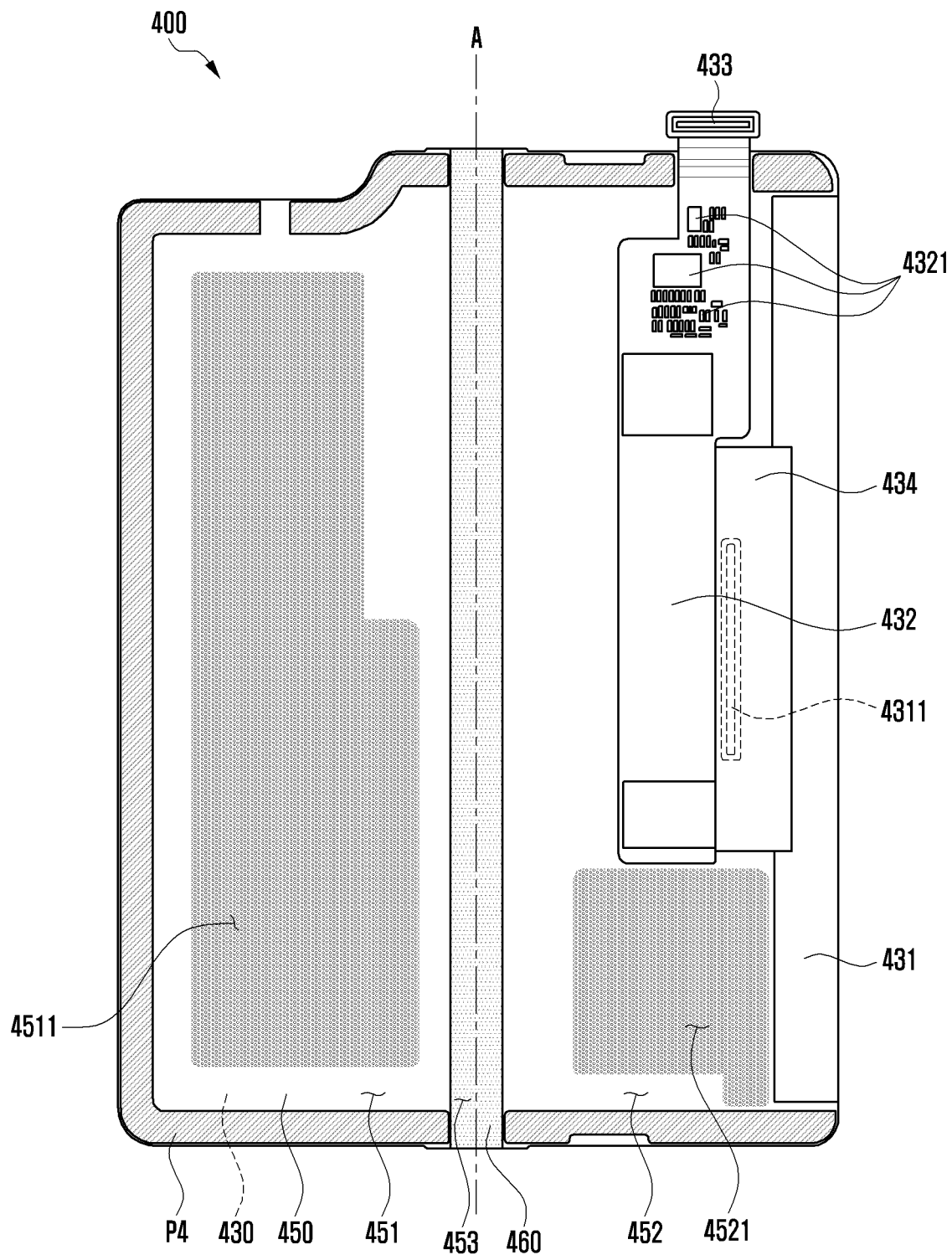
FIG. 4C is a diagram illustrating a rear surface of a display according to an embodiment of the disclosure.

FIG. 4C is a diagram illustrating a rear surface of a display 400 according to an embodiment of the disclosure.

Referring to FIG. 4C, the display 400 may include an extension portion 431 disposed in a folding manner from the display panel 430 to at least a partial area of a rear surface of the display 400. According to one embodiment, the display 400 may include a connection pad 434 electrically connected to the extension portion 431 and having an electrical wiring structure including a control circuit 4311 and a flexible printed circuit board (FPCB) 432 electrically connected to the connection pad 434. According to an embodiment, the control circuit 4311 may include a display driver IC (DDI) or a touch display driver IC (TDDI) mounted in the connection pad 434 having an electrical wiring structure. According to an embodiment, the connection pad 434 may include a separate FPCB or film including a control circuit 4311 disposed in a chip on film (COF) manner. In another embodiment, the control circuit 4311 may have a chip on panel (COP) structure mounted directly in the extension portion 431 without a connection pad 434. According to one embodiment, a plurality of elements 4321 may be mounted in the FPCB 432, and the FPCB 432 may include an electrical connector 433 electrically connected to a second printed circuit board (e.g., the second printed circuit board 172 of FIG. 3) of the electronic device (e.g., the electronic device 100 of FIG. 3). According to an embodiment, the plurality of elements 4321 may include a touch IC, a flash memory for a display, an electro static discharge (ESD) prevention diode, a pressure sensor, or a passive element such as a decap. In another embodiment, when the extension portion 431, the connection pad 434, and the FPCB 432 are disposed in an area facing the first housing structure (e.g., the first housing structure 110 of FIG. 1) of the display 400, the electrical connector 433 may be electrically connected to a first printed circuit board (e.g., the first printed circuit board 171 of FIG. 3) of the electronic device (e.g., the electronic device 100 of FIG. 1).

According to various embodiments, the display 400 may include a conductive plate 450 having substantially the same size and shape as those of the display panel 430. According to one embodiment, the conductive plate 450 may include a first flat portion 451 facing a first area (e.g., the first area h1 of FIG. 4B) of the display 400, a second flat portion 452 facing a second area (e.g., the second area h2 of FIG. 4B) of the display 400, and a flexible portion 453 facing a third area (e.g., the third area h3 of FIG. 4B) of the display 400. According to an embodiment, the conductive plate 450 may be formed in a state in which the first flat portion 451, the second flat portion 452, and the flexible portion 453 are connected without disconnection. According to one embodiment, in the conductive plate 450, the first flat portion 451, the second flat portion 452, and the flexible portion 453 may be integrally formed. According to one embodiment, the conductive plate 450 may be attached to a rear surface of a polymer member (e.g., the polymer member 440 of FIG. 4B) through the adhesive member (e.g., the adhesive member P3 of FIG. 4B) so as to be folded or unfolded together with the display panel 430 through at least a portion of the flexible portion 453. Further, the conductive plate 450 may provide airtightness to block a foreign material that may be introduced from the outside through a conductive elastic member 460 attached from a portion of the first flat portion 451 to a portion of the second flat portion 452 through the flexible portion 453. According to an embodiment, the conductive plate 450 may receive at least partially flexibility of the flexible portion 453 through the conductive elastic member 460. According to one embodiment, the conductive elastic member 460 may have an elongation rate of about 1% or more. The conductive plate 450 may include lightweight areas 4511 and 4521 disposed in at least some areas of the first flat portion 451 and the second flat portion 452. The lightweight areas 4511 and 4521 may be configured through a plurality of holes spaced apart from each other. In another embodiment of the disclosure, the lightweight areas 4511 and 4521 may be configured through one relatively large hole.

Hereinafter, a configuration of the conductive plate 450 will be described in detail.

Figure 5A:
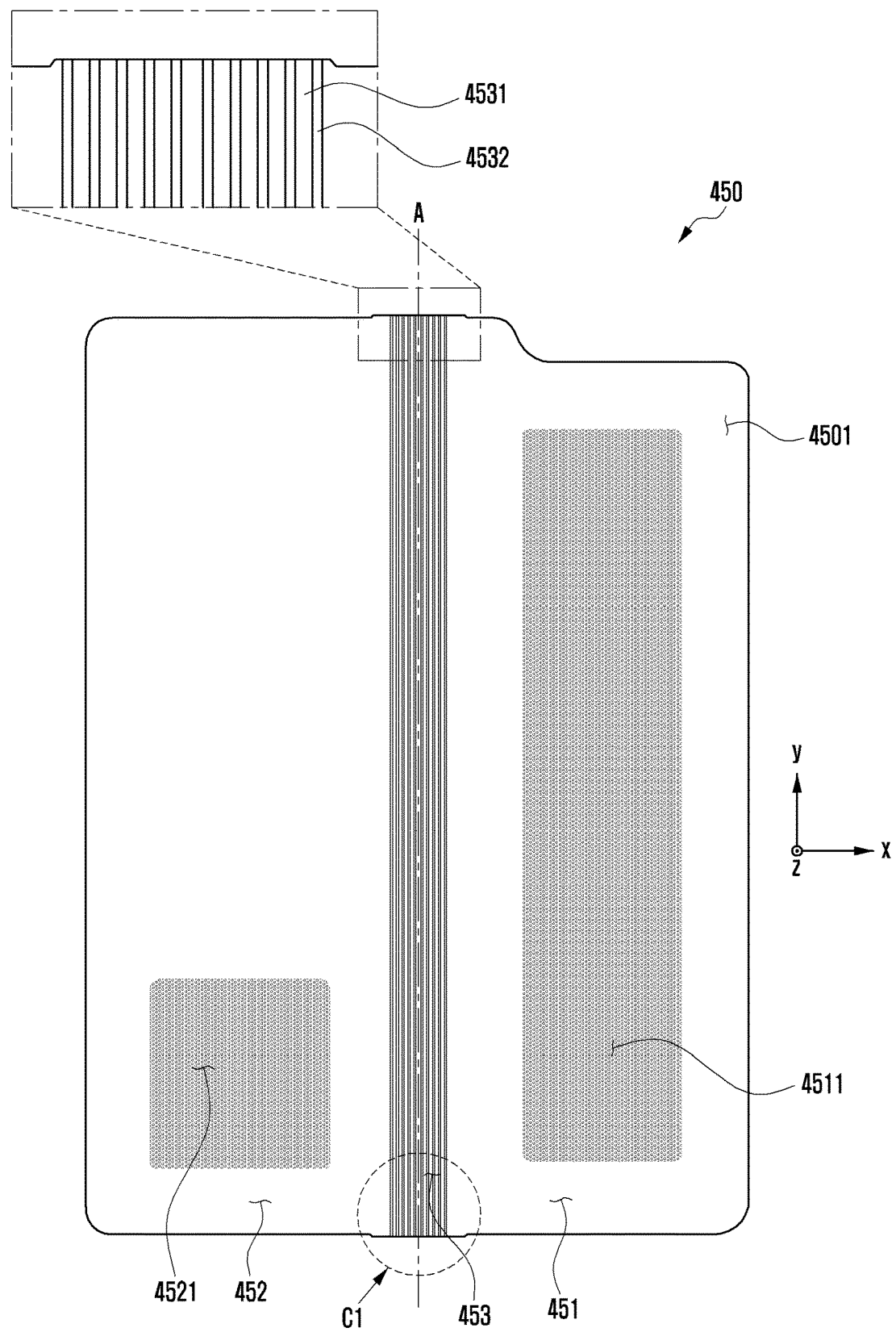
FIGS. 5A and 5B are diagrams illustrating a front surface and a rear surface of a conductive plate according to various embodiments of the disclosure.
Figure 5B:
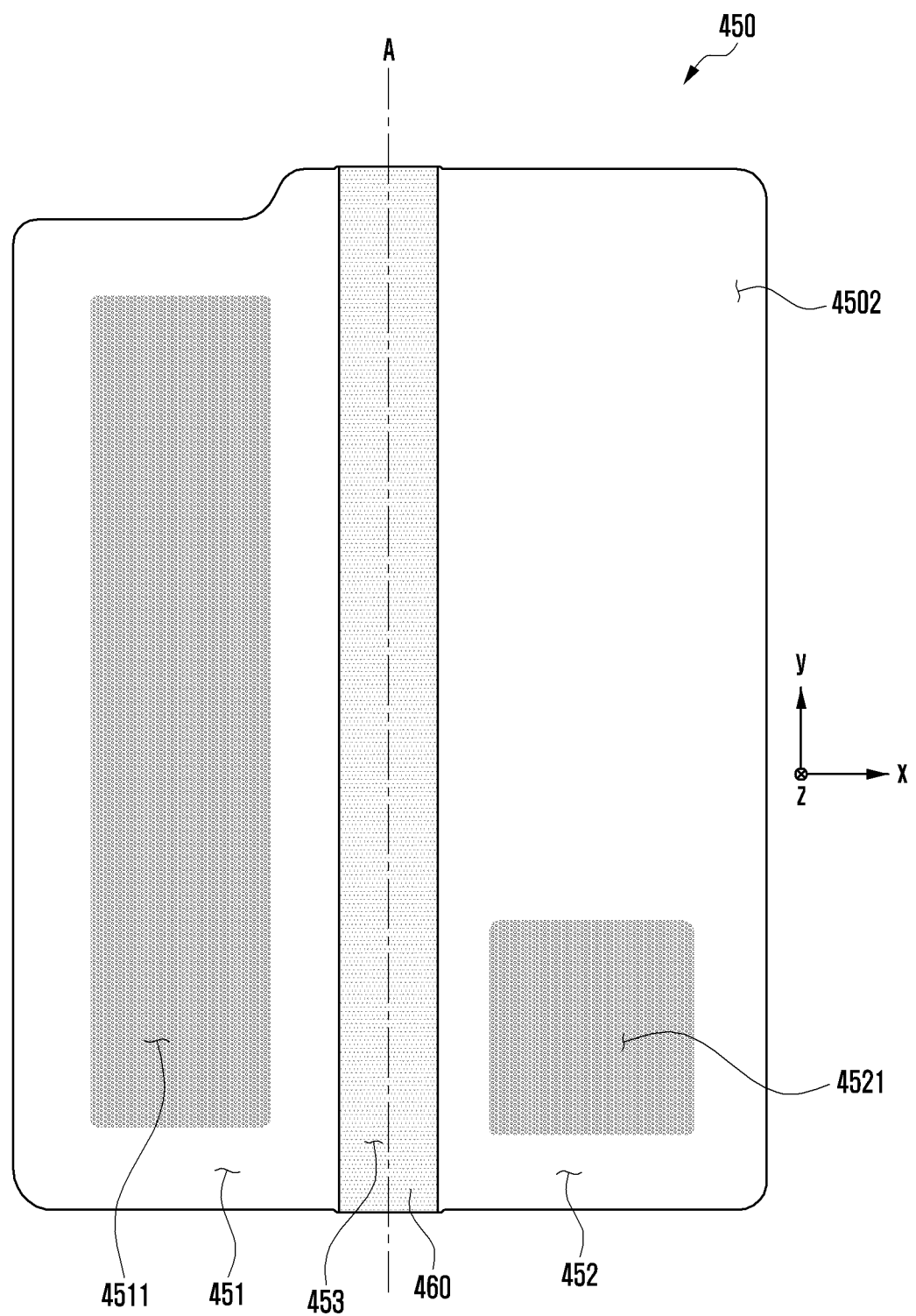

FIGS. 5A and 5B are diagrams illustrating a front surface 4501 and a rear surface 4502 of a conductive plate 450 according to various embodiments of the disclosure.

Figure 5C:
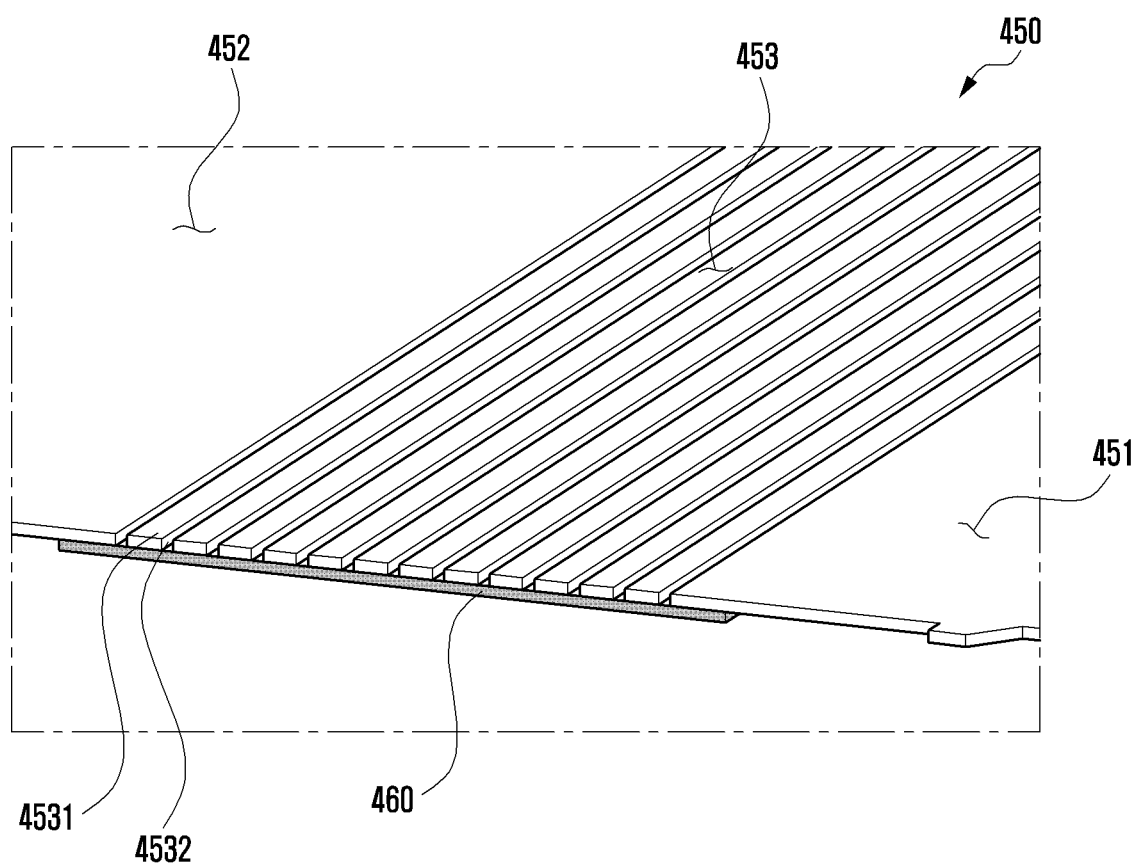
FIG. 5C is a partial perspective view illustrating an area C1 of FIG. 5A according to an embodiment of the disclosure.

FIG. 5C is a partial perspective view illustrating an area C1 of FIG. 5A according to an embodiment of the disclosure.

Referring to FIGS. 5A to 5C, the conductive plate 450 may include a first flat portion 451 facing a first area (e.g., the first area h1 of FIG. 4B) of the display (e.g., the display 400 of FIG. 4B), a second flat portion 452 facing a second area (e.g., the second area h2 of FIG. 4B) of the display 400, and a flexible portion 453 facing a third area (e.g., the third area h3 of FIG. 4B) of the display 400. According to an embodiment, the conductive plate 450 may be folded together with the display panel (e.g., the display panel 430 of FIG. 4B) through at least a portion of the flexible portion 453. According to an embodiment, when bending occurs in the third area h3 of the display 400, at least a portion of the flexible portion 453 may be disposed to support a rear surface of the display panel (e.g., the display panel 430 of FIG. 4B). In another embodiment, the third area h3 may correspond only to at least a portion of the flexible portion 453.

According to various embodiments, the conductive plate 450 may include a plurality of support pieces 4531 disposed between the first flat portion 451 and the second flat portion 452 and spaced apart by slits 4532 at regular interval or irregular intervals. According to an embodiment, the plurality of support pieces 4531 may be spaced apart in a width direction (X-axis direction) of the conductive plate 450. According to an embodiment, the plurality of support pieces 4531 may be extended in a longitudinal direction (Y-axis direction) of the conductive plate 450 in a state spaced apart from each other. Accordingly, the flexible portion 453 may include a plurality of slits 4532 formed through mutually spaced disposition of the plurality of support pieces 4531. According to an embodiment, the conductive plate 450 may include a conductive elastic member 460 disposed to connect a plurality of support pieces 4531 of the flexible portion 453. According to one embodiment, the conductive elastic member 460 may include a conductive elastic tape member or a conductive elastic film member attached from a portion of the first flat portion 451 to at least a portion of the second flat portion 452 through the plurality of support pieces 4531 at the rear surface of the conductive plate 450. According to one embodiment, the conductive elastic tape member may be made of at least one of conductive rubber, conductive silicone, or conductive urethane.

According to various embodiments, the first flat portion 451 and the second flat portion 452 of the conductive plate 450 spaced apart from each other are electrically connected to each other through the conductive elastic member 460, thereby being smoothly electrically connected to a ground area of a printed circuit board inside the electronic device.

Figure 6:
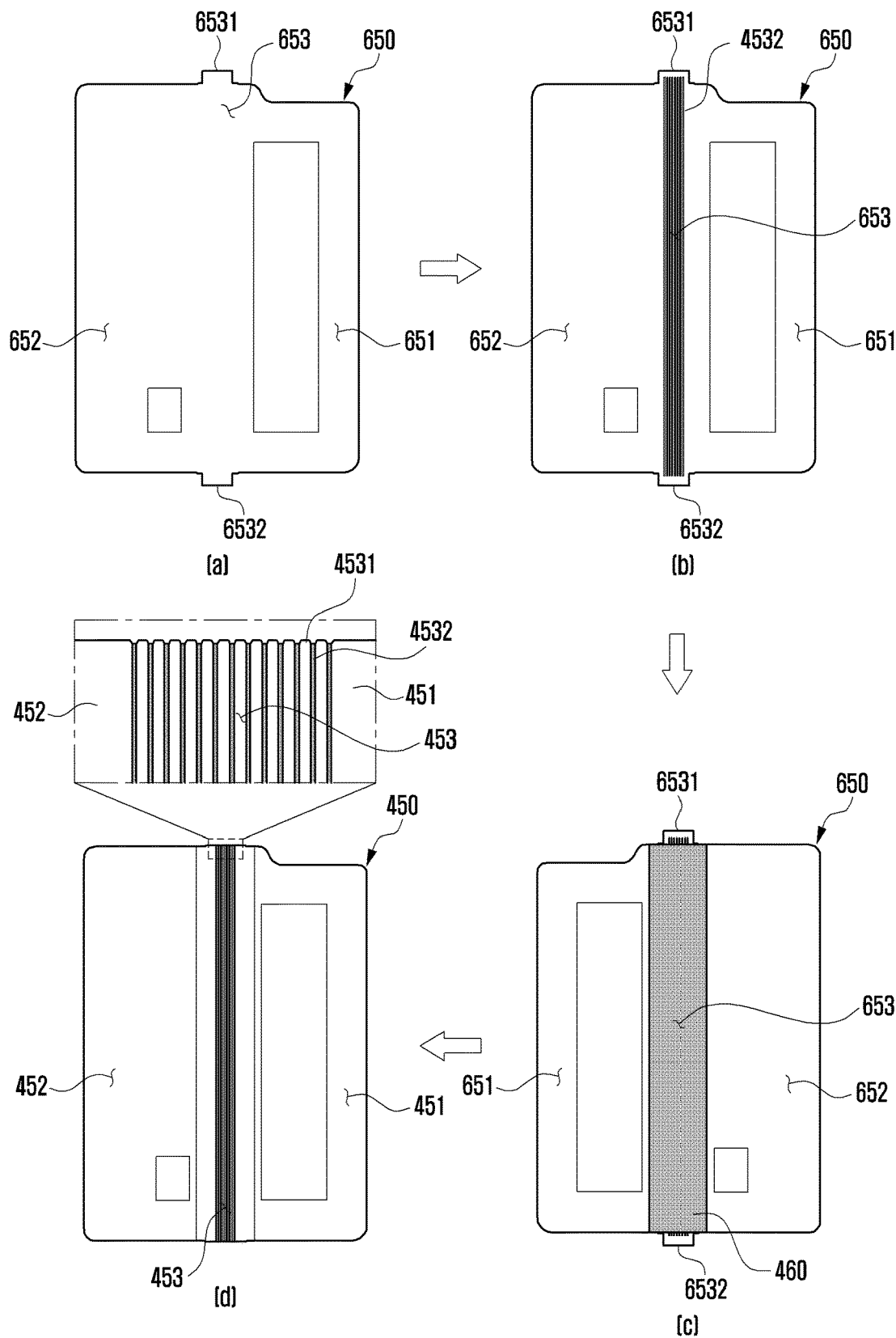
FIG. 6 is a diagram illustrating a production process of a conductive plate according to various embodiments of the disclosure.

FIG. 6 is a diagram illustrating a production process of a conductive plate 450 according to various embodiments of the disclosure.

Referring to item [a] in FIG. 6, a plate-shaped metal base material 650 may be provided. In this case, in the metal base material 650, a first flat portion 651, a second flat portion 652, and a flexible portion 653 may be integrally formed. According to an embodiment, the metal base material 650 may include protruding flanges 6531 and 6532 protruded outwardly from upper and lower edges of the flexible portion 653, respectively. According to one embodiment, the metal base material 650 may be made of at least one of Cu, Al, SUS, or CLAD (e.g., a stacked member in which SUS and Al are alternately disposed). According to one embodiment, the metal base material 650 may be formed through punching, press, or laser processing.

Referring to item [b] in FIG. 6, the metal base material 650 may include a plurality of slits 4532 formed at regular or irregular intervals in a width direction in the flexible portion 653. According to one embodiment, the plurality of slits 4532 may be extended from the flexible portion 653 to a pair of protruding flanges 6531 and 6532 beyond a virtual extension line extended to an edge of the first flat portion 651 and/or the second flat portion 652. According to one embodiment, the plurality of slits 4532 may be formed through a laser process through masking or etching processing.

Referring to item [c] in FIG. 6, the conductive elastic member 460 may be disposed in an area corresponding to the flexible portion 653. According to one embodiment, the conductive elastic member 460 may include a flexible portion 653 and be attached to a portion of the first flat portion 651 and a portion of the second flat portion 652. According to an embodiment, the conductive elastic member 460 may be disposed at a surface (e.g., the front surface 4501 of FIG. 5A) facing the display panel 430 of the conductive plate 450 and a surface (e.g., the rear surface 4502 of FIG. 5B) facing in a direction opposite thereto.

Referring to item [d] in FIG. 6, a pair of protruding flanges 6531 and 6532 are cut (e.g., laser cutting) to correspond to edges of the first flat portion 651 and the second flat portion 652; thus, the conductive plate 450 may be completed. According to one embodiment, even if the pair of protruding flanges 6531 and 6532 are removed through a cutting process, the plurality of support pieces 4531 separated by the plurality of slits 4532 may maintain a state connected to each other through the conductive elastic member 460. Further, the flexible portion 453 may provide flexibility through the plurality of support pieces 4531 spaced apart through the plurality of slits 4532 and connected through the conductive elastic member 460. Further, because the plurality of slits 4532 are closed through the conductive elastic member 460, an exterior foreign material can be prevented from entering the front surface of the conductive plate 450.

Figure 7A:
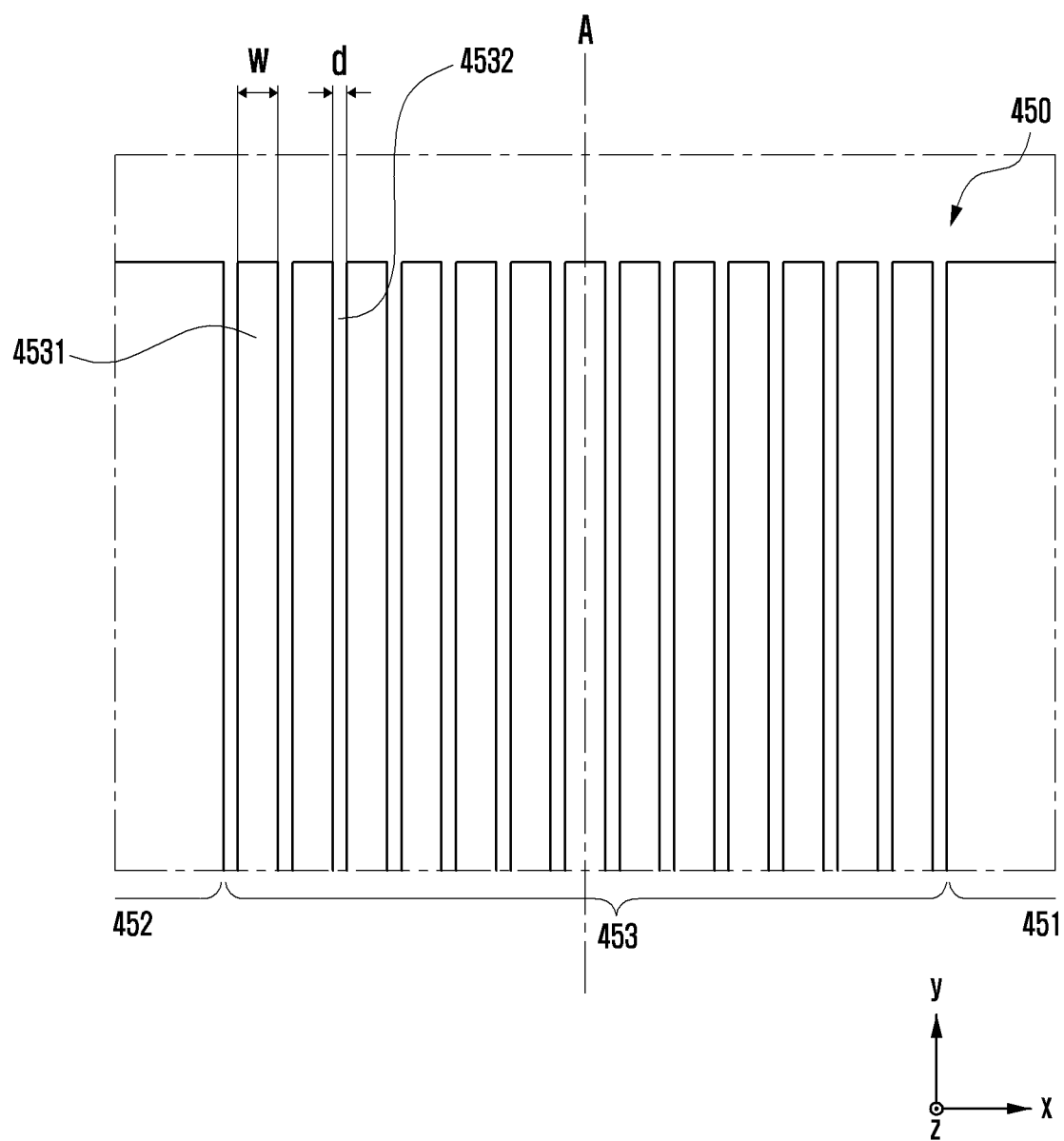
FIGS. 7A, 7B, and 7C are diagrams illustrating a portion of a flexible portion of a conductive plate according to various embodiments of the disclosure.
Figure 7B:
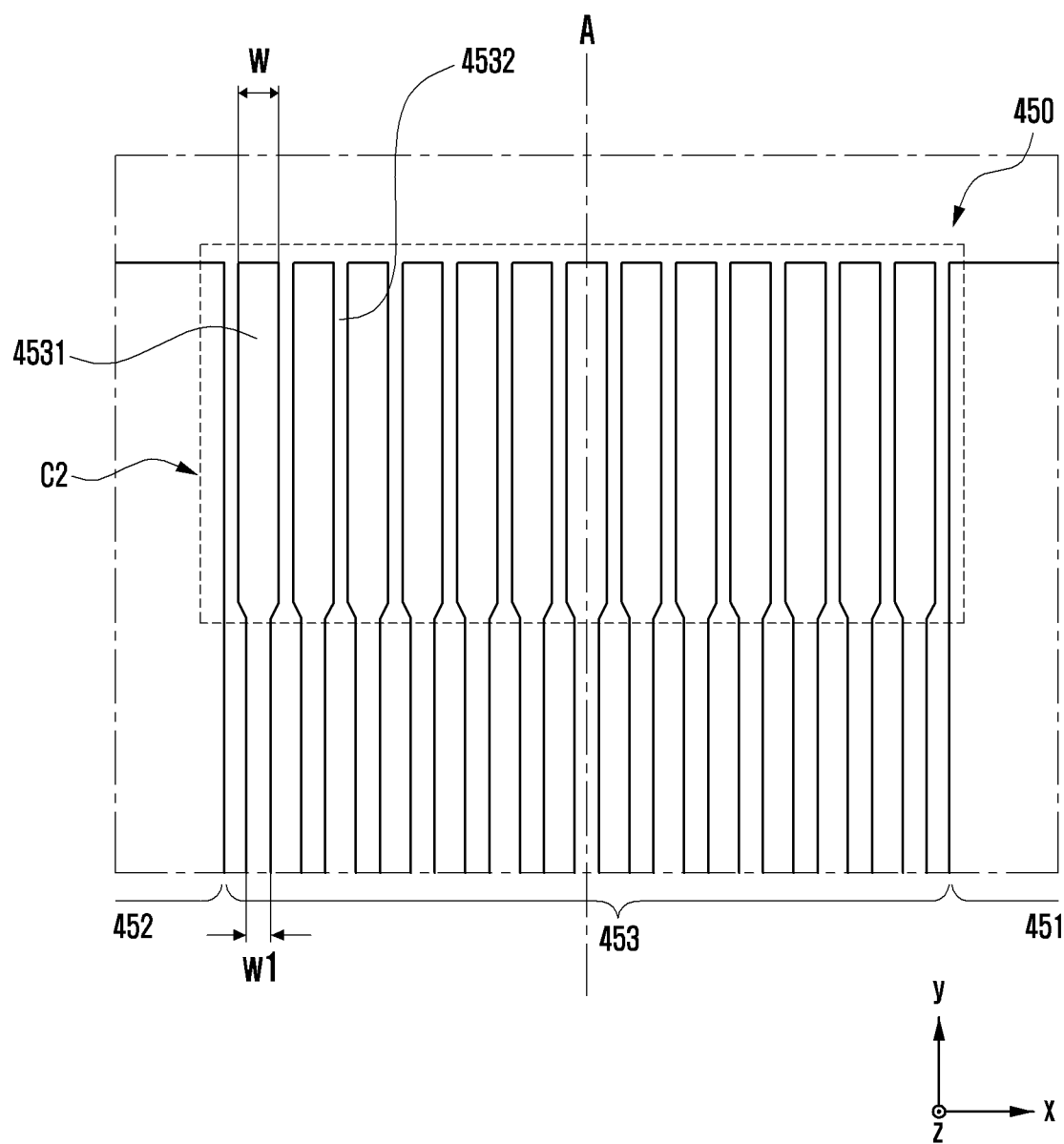
Figure 7C:
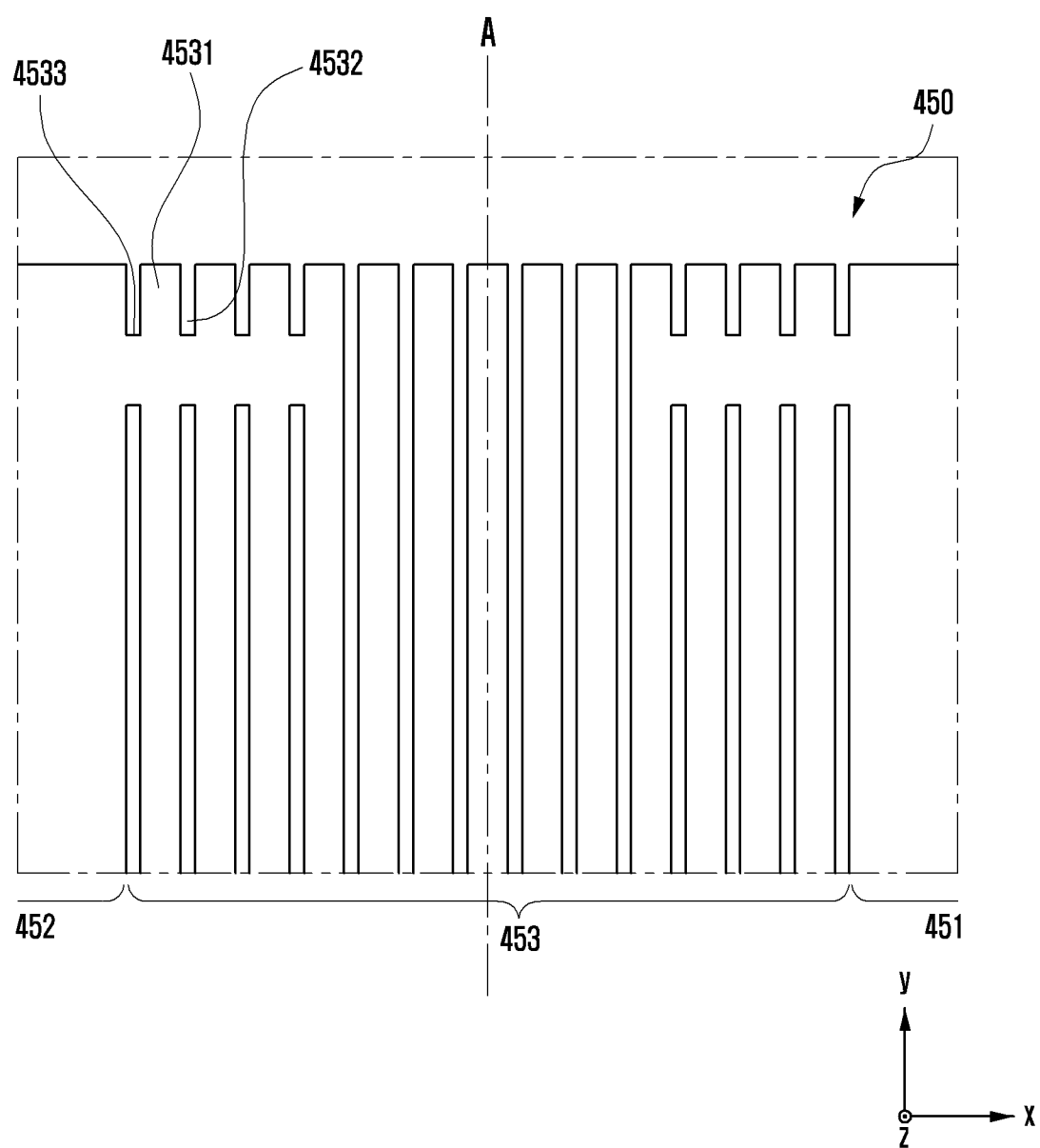

FIGS. 7A to 7C are diagrams illustrating a portion of a flexible portion 453 of a conductive plate 450 according to various embodiments of the disclosure.

Referring to FIG. 7A, in the flexible portion 453 of the conductive plate 450, a plurality of support pieces 4531 having a predetermined width w may be disposed through the slits 4532 having a predetermined distance d. According to one embodiment, flexibility of the flexible portion 453 of the conductive plate 450 may be determined through a change in shape and/or disposition density of the plurality of support pieces 4531 and the slits 4532. According to one embodiment, flexibility of the flexible portion 453 may be determined through a change in the width w of the plurality of support pieces 4531. For example, the flexible portion 453 may be formed such that a width w of the plurality of support pieces 4531 having the same distance d gradually increases or decreases as it laterally progresses based on an axis A, thereby adjusting flexibility. According to one embodiment, the flexible portion 453 may be formed such that a distance d between the plurality of support pieces 4531 having the same width w gradually increases or decreases as it laterally progresses based on the axis A, thereby adjusting flexibility. According to one embodiment, flexibility of the flexible portion 453 may be adjusted through different widths and different distances d from those of the plurality of support pieces 4531.

Referring to FIG. 7B, the conductive plate 450 may include a rigid reinforcement area C2 formed in an upper area of the flexible portion 453. According to an embodiment, the rigid reinforcement area C2 may be disposed in upper end and lower end areas of the flexible portion 453 in which fatigue is relatively largely accumulated according to a frequent folding operation of the conductive plate 450. Although not illustrated, the lower end area of the flexible portion 453 may also include substantially the same rigid reinforcement area C2.

According to various embodiments, the flexible portion 453 may be configured such that a first width w of the plurality of support pieces 4531 in the rigid reinforcement area C2 is larger than a second width w1 in the other areas. For example, by different widths of the plurality of support pieces 4531, distances between the plurality of support pieces 4531 in the rigid reinforcement area C2 and other areas may be formed differently.

Referring to FIG. 7C, the flexible portion 453 may include a connection portion 4533 in which at least some of the plurality of support pieces 4531 are connected to each other in the rigid reinforcement area C2. According to one embodiment, an area in which the support pieces 4531, which are at least partially connected through the connection portion 4533 is formed, may be reinforced in stiffness than the other areas. As illustrated, the flexible portion 453 is formed to have one connecting portion 4531 for connecting at least some of the plurality of supporting pieces 4531, but it is not limited thereto. For example, when the flexible portion 453 requires relatively stronger rigidity, the area may be formed to have two or three or more connecting portions 4533.

Figure 8:
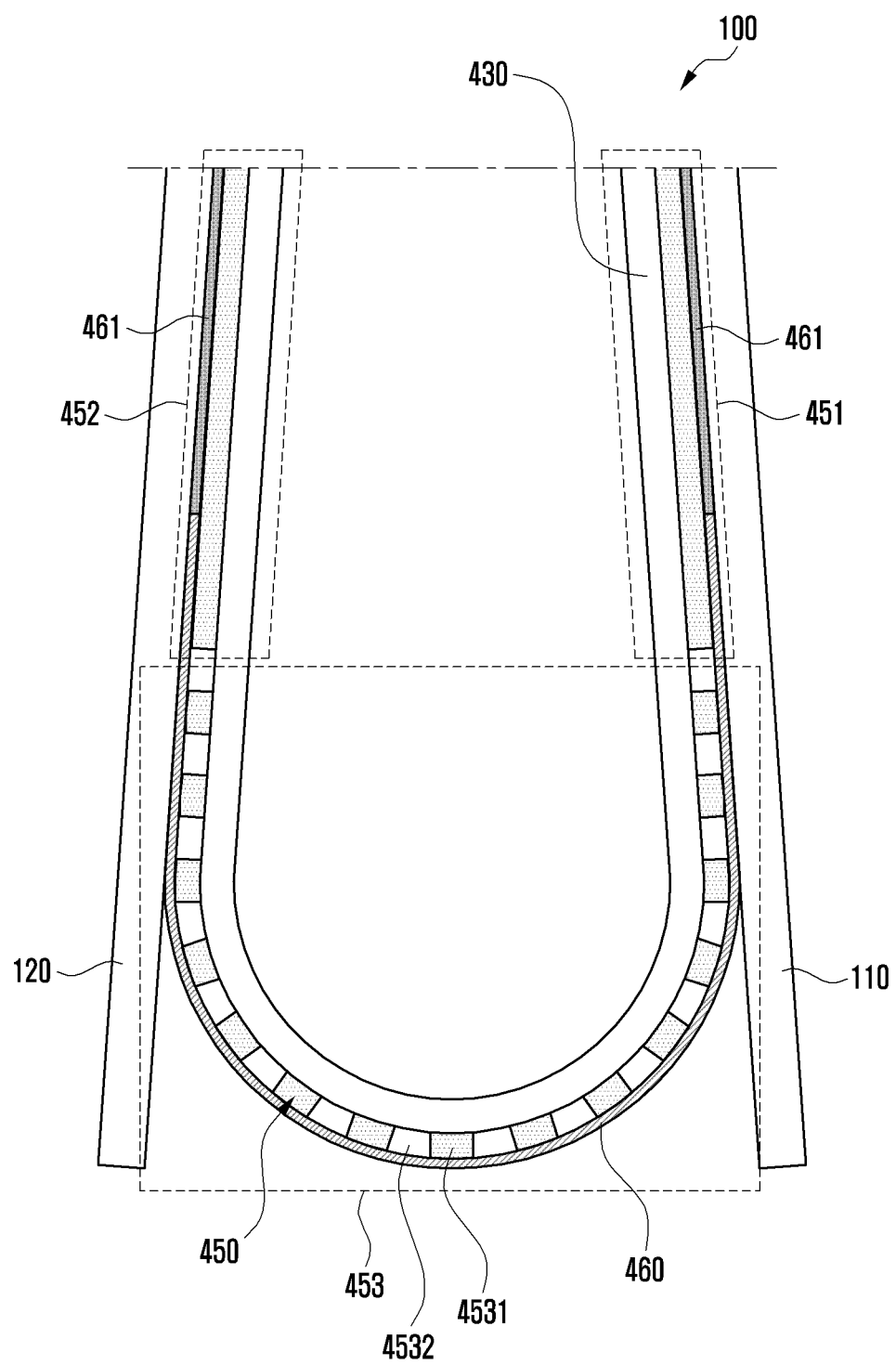
FIG. 8 is a partial cross-sectional view illustrating a folded state of an electronic device according to an embodiment of the disclosure.

FIG. 8 is a partial cross-sectional view illustrating a folded state of an electronic device 100 according to an embodiment of the disclosure.

Referring to FIG. 8, the conductive plate 450 may include a first flat portion 451 at least partially attached to the first housing structure 110, a second flat portion 452 at least partially attached to the second housing structure 120, and a flexible portion 453 that provides at least partially flexibility through the conductive elastic member 460 that connects the first flat portion 451 and the second flat portion 452 and that connects the plurality of support pieces 4531 spaced apart through the slits 4532. According to one embodiment, at least a portion of the flexible portion 453 may be attached to the first housing structure 110 and the second housing structure 120 together with the conductive elastic member 460 to prevent a foreign material from entering from the outside and to prevent a stress concentration phenomenon generating at a boundary portion of each of the flat portions 451 and 452 and the flexible portion 453.

According to various embodiments, one end of the conductive elastic member 460 may be disposed between the first housing structure 110 and the first flat portion 451, and the other end thereof may be disposed between the second housing structure 120 and the second flat portion 452. According to an embodiment, a step compensating member 461 for compensating a thickness of the conductive elastic member 460 and for providing insulation may be further disposed between the first flat portion 451 and the first housing structure 110 and between the second flat portion 452 and the second housing structure 120 in which the conductive elastic member 460 is not disposed.

Figure 9A:
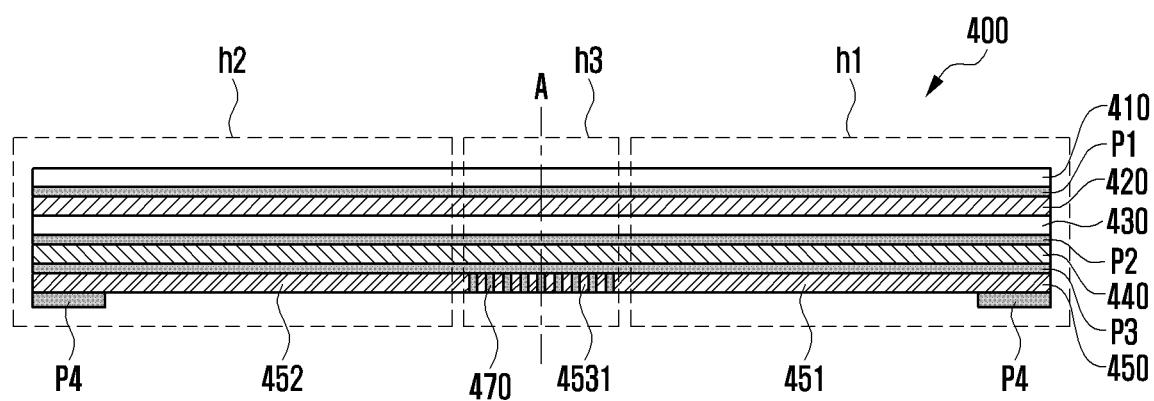
FIG. 9A is a partial cross-sectional view illustrating a display according to an embodiment of the disclosure.

FIG. 9A is a partial cross-sectional view illustrating a display 400 according to an embodiment of the disclosure.

Figure 9B:
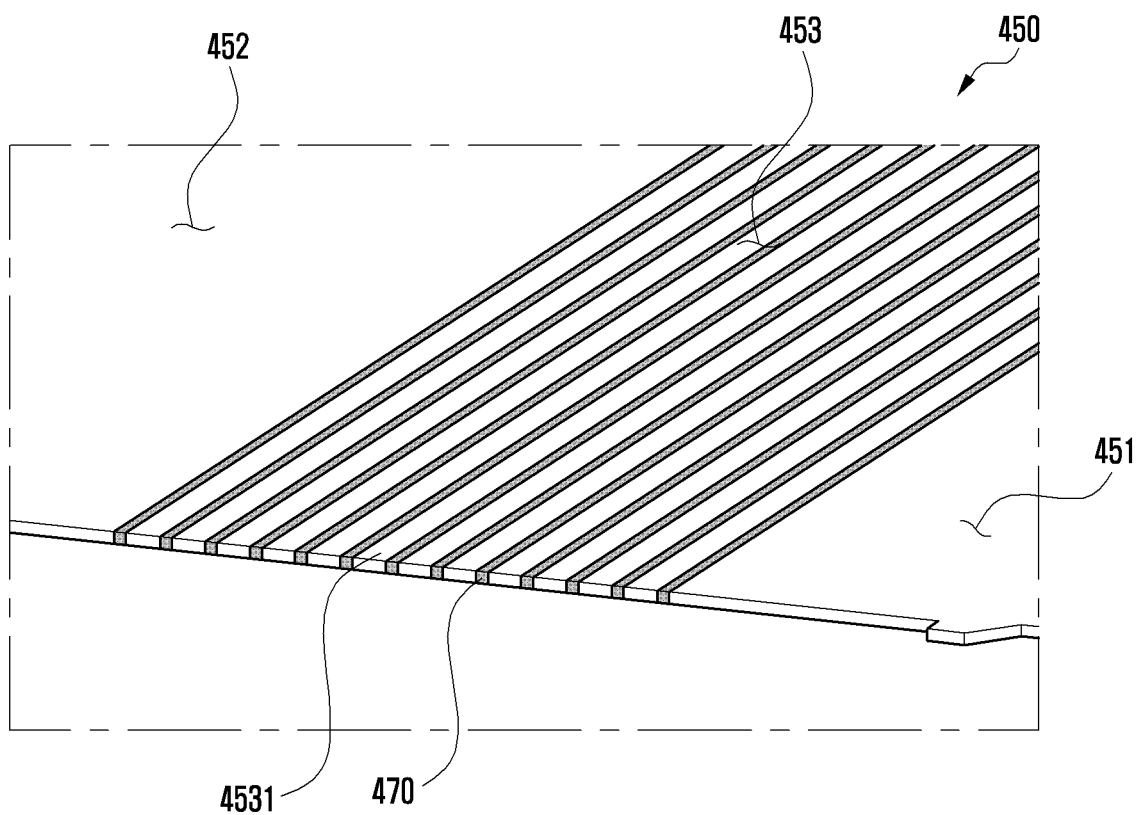
FIG. 9B is a partial perspective view illustrating a state in which a conductive elastic member is applied to a flexible portion according to an embodiment of the disclosure.

FIG. 9B is a partial perspective view illustrating a state in which a conductive elastic member 470 is applied to a flexible portion 453 according to an embodiment of the disclosure.

Referring to FIGS. 9A and 9B, components that are substantially the same as the display 400 of FIG. 4B are denoted by the same reference numerals; thus, a detailed description thereof may be omitted.

Referring to FIGS. 9A and 9B, in the flexible portion 453, a plurality of support pieces 4531 disposed to be spaced apart by a plurality of slits 4532 may be connected through the conductive elastic member 470 filled in the slits 4532 and provide flexibility. According to an embodiment, the conductive elastic member 470 may filled only in the slits 4532 without being exposed at an outer surface of the display 400. For example, the conductive elastic member 470 may include a conductive elastic resin impregnated into the slits 4532 and then cured. According to an embodiment, in a process in which the conductive elastic member 460 (e.g., a conductive elastic tape member) is applied among the above-described processes of FIG. 6, by replacing the conductive elastic member 460 with the conductive elastic resin, the conductive elastic resin may be applied to a production process of the conductive plate 450.

According to various embodiments of the disclosure, as an integral foldable conductive plate is provided to support a foldable flexible display, a foreign material is prevented from entering according to frequent folding operations; thus, reliability of a display can be improved, and in a folding area, a folding mark of the display can be prevented from occurring, and flexibility of each area according to various folding characteristics of the electronic device can be adjusted, thereby improving operational reliability.

Figure 10A:
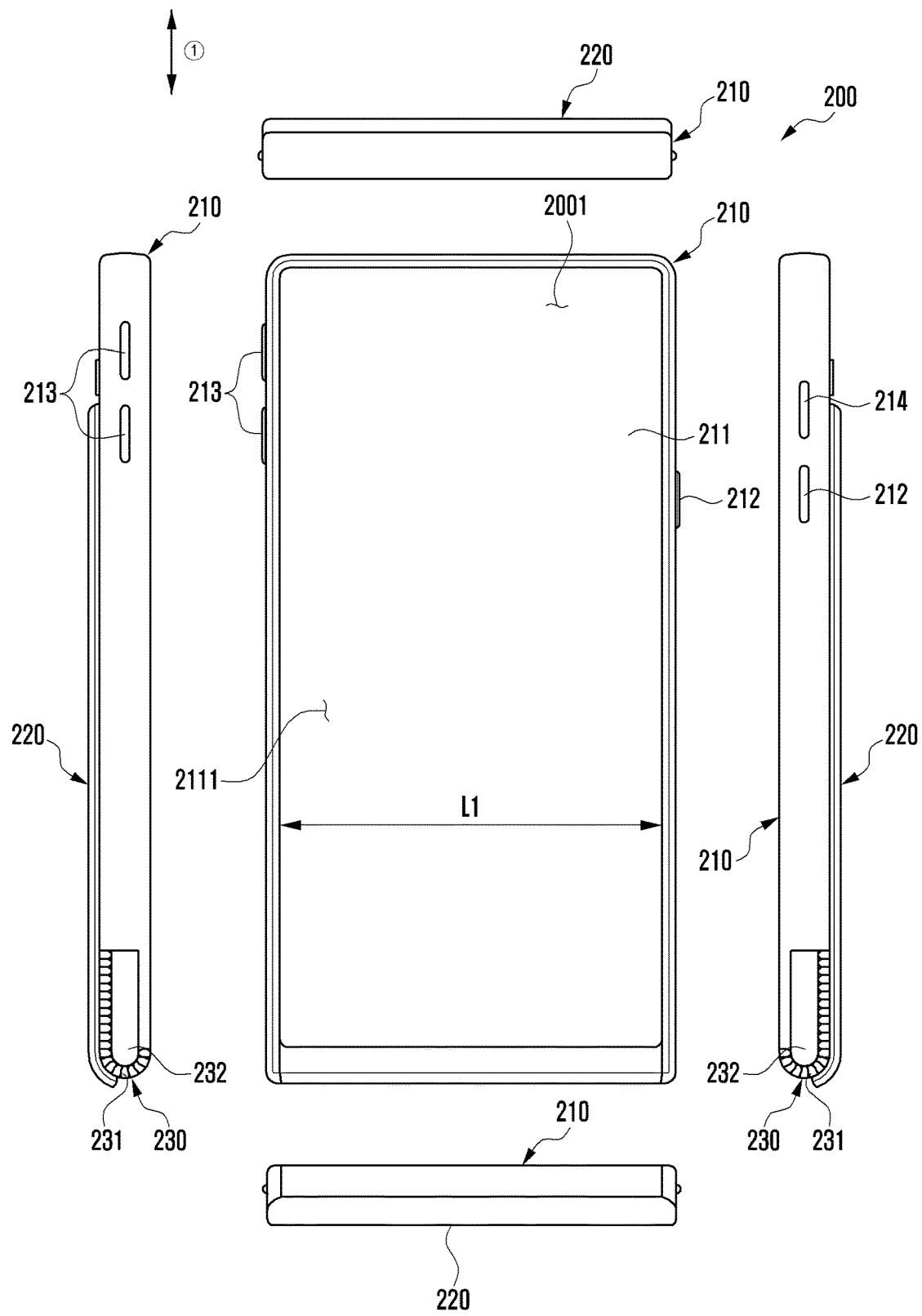
FIGS. 10A and 10B are diagrams illustrating a change relationship of a display area of a front display of an electronic device according to various embodiments of the disclosure.
Figure 10B:
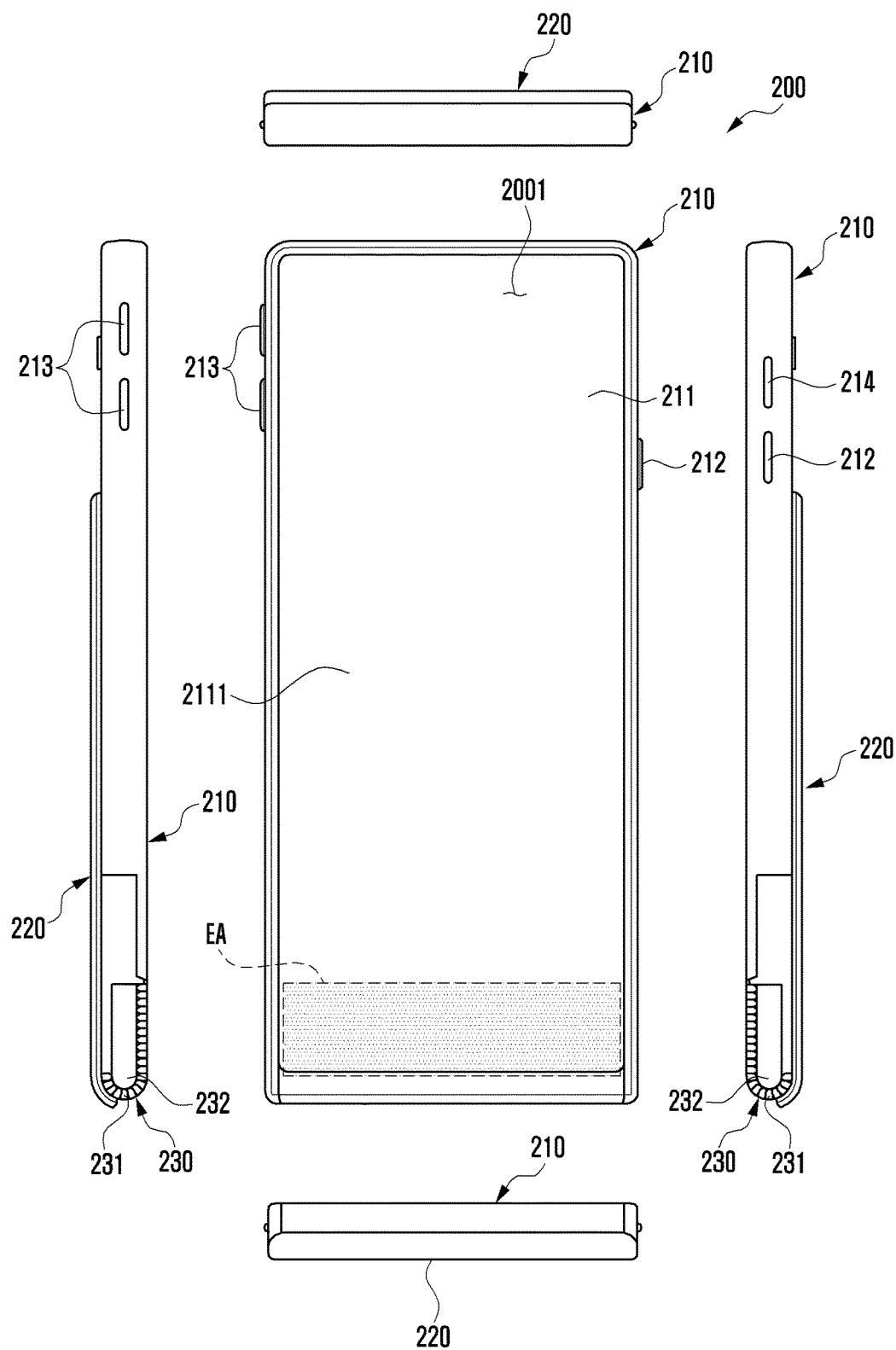
Figure 11A:
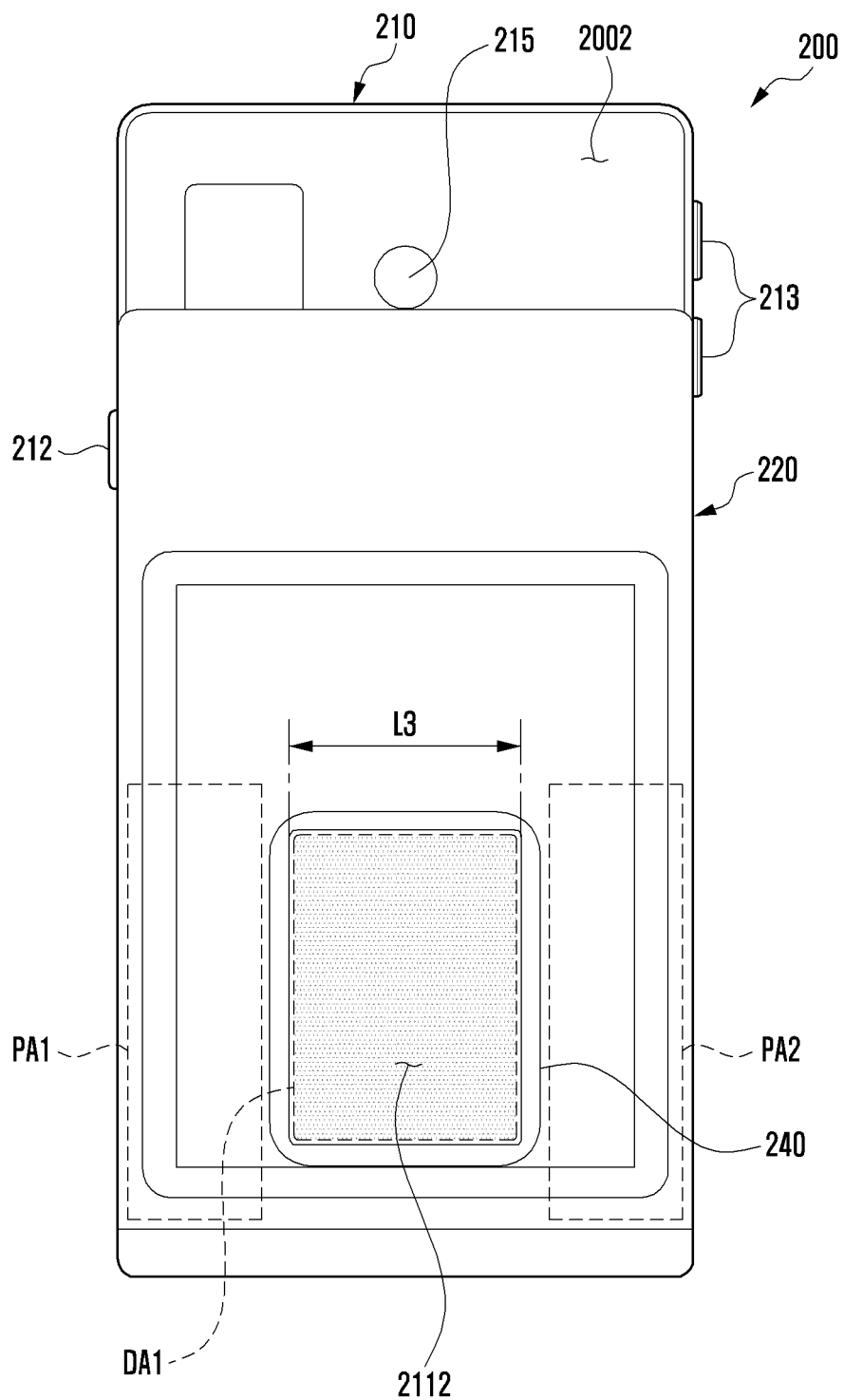
FIGS. 11A and 11B are diagrams illustrating a change relationship of a display area of a rear display of an electronic device according to various embodiments of the disclosure.
Figure 11B:
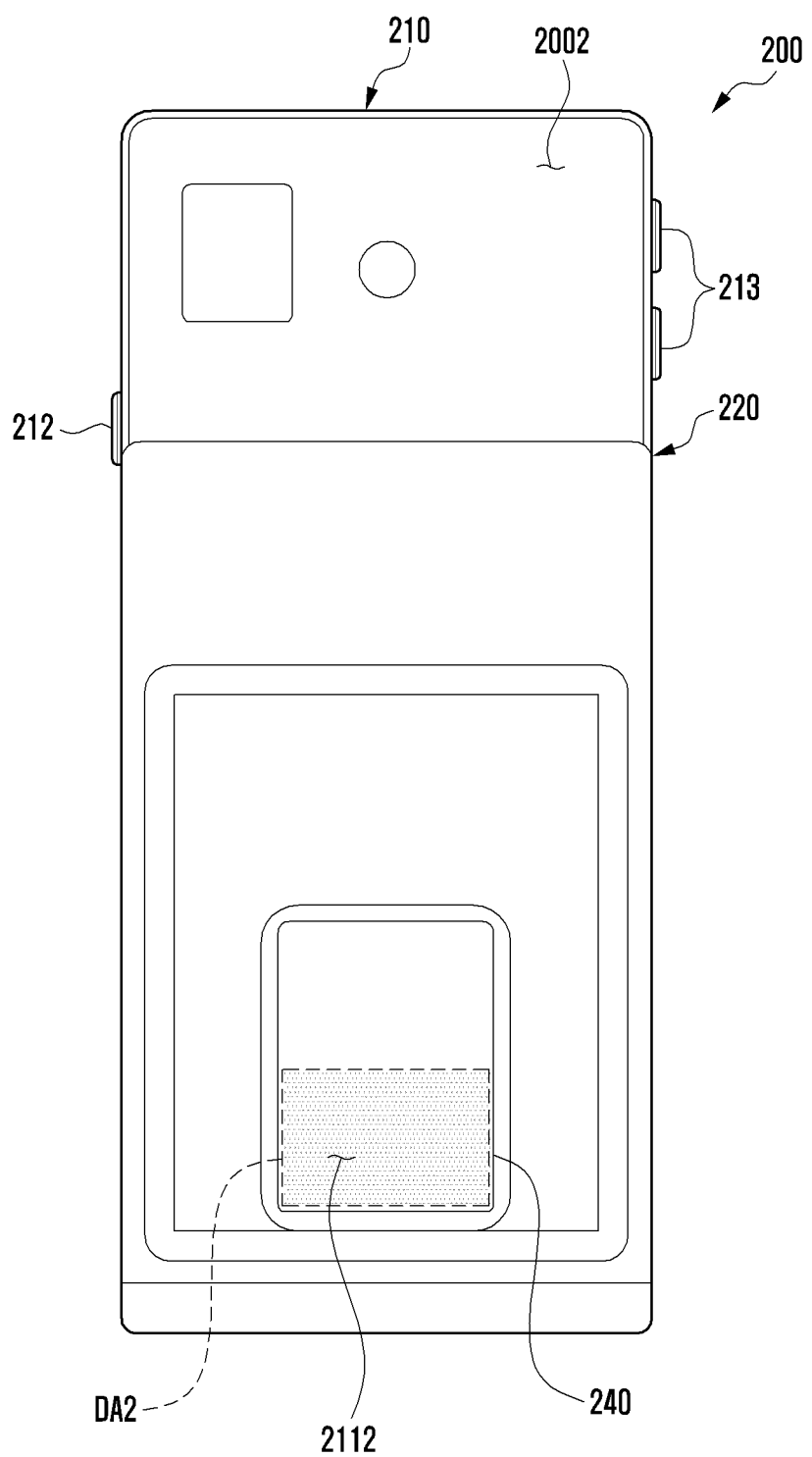

FIGS. 10A and 10B are diagrams illustrating a change relationship of a display area of a front display of an electronic device 200 according to various embodiments of the disclosure. FIGS. 11A and 11B are diagrams illustrating a change relationship of a display area of a rear display of an electronic device 200 according to various embodiments of the disclosure.

The electronic device 200 (e.g., slideable electronic device, slide type electronic device, rollable electronic device, or rolling type electronic device) of FIGS. 10A to 11B may include a display 211 (e.g., flexible display) in which a display area is changed as a second structure 220 (e.g., slide cover, slide plate, or slide body) is changed to a closed state (slide-in) and an open state (slide-out) with respect to the first structure 210 (e.g., housing or main body).

FIG. 10A illustrates a state in which the first structure 210 is closed with respect to the second structure 220 according to various embodiments of the disclosure, and FIG. 10B illustrates a state in which the first structure 210 is opened with respect to the second structure 220.

Referring to FIGS. 10A and 10B, the electronic device 200 may include a first structure 210 and a second structure 220 disposed to be movable in the first structure 210. According to an embodiment, the first structure 210 may be disposed to reciprocate by a predetermined distance in the illustrated direction ① based on the second structure 220.

According to various embodiments, the electronic device 200 may include a display 211 disposed at a front surface 2001 (e.g., first surface) of the first structure 210. According to an embodiment, the display 211 may include a front display area 2111 exposed through the front surface 2001 of the first structure 210. According to an embodiment, the electronic device 200 may include a first key button 212 or a second key button 213 disposed in at least one of left and right side surfaces. According to an embodiment, the first key button 212 or the second key button 213 may be disposed in a manner exposed at or protruding from the side surface of the electronic device 200. According to an embodiment, the first key button 212 may be a power button. In another example, the second key button 213 may be a volume control button. According to an embodiment, the electronic device 200 may include at least one speaker device 214 disposed at the side surface. According to an embodiment, the speaker device 214 may be disposed at various locations other than a display disposition area of the electronic device 200.

According to various embodiments, the electronic device 200 may include a rollable module 230 disposed at a boundary between the first structure 210 and the second structure 220. According to one embodiment, the rollable module 230 may be disposed so that two structures relatively move between the first structure 210 and the second structure 220. The rollable module 230 may include a multi joint module 231 disposed in a rollable manner at an end portion of an inner support member 232 partially exposed at the side surface. According to an embodiment, when the first structure 210 reciprocates in a direction ① with respect to the second structure 220, the multi joint module 231 may be moved together to guide the front display 211.

According to various embodiments, when the first structure 210 is changed to an open state by a predetermined length in the direction ① with respect to the second structure 220, a display area of the front display 211 disposed at the front surface 2001 of the electronic device 200 may be extended by an area EA of a predetermined size.

FIG. 11A illustrates a state in which the first structure 210 is closed with respect to the second structure 220, and FIG. 11B illustrates a state of the electronic device 200 in which the first structure 210 is opened with respect to the second structure 220.

Referring to FIGS. 11A and 11B, the electronic device 200 may include a second structure 220 disposed to be movable relative to the first structure 210 at a rear surface 2002. According to an embodiment, the electronic device 200 may include a rear camera device 215 disposed at the first structure 210 among the rear surface 2002. According to one embodiment, the electronic device 200 may include a rear display area 2112 extended from a front display area (e.g., the front display area 2111 of FIG. 10A) of the display (e.g., the display 211 of FIG. 10A) that may be visible through a through hole 240 formed in the second structure 220 of the rear surface 2002. According to one embodiment, the electronic device 200 may include a front display area 2111 and a rear display area 2112 at the front surface 2001 and the rear surface 2002, respectively, but inside the electronic device 200, one display (e.g., the display 211 of FIG. 10A) may be extended in a rolling manner to the front surface 2001 to the rear surface 2002 of the electronic device 200. According to one embodiment, in the rear display area 2112 of the electronic device 200, when the first structure 210 remains a closed state with respect to the second structure 220, an entire area DA1 of the rear display area 2112 may be a display area. According to an embodiment, when the first structure 210 is switched to an open state with respect to the second structure 220, the rear display area 2112 of the electronic device 200 may be changed to a display area DA2 smaller than the entire display area DA1 of the rear display area 2112. However, it is not limited thereto, and the display area displayed in the rear display area 2112 may be defined to various display areas according to a designer's design or a user's setting.

According to various embodiments, the rear display area 2112 may be formed to have a width L3 smaller than the width (e.g., the width L1 of FIG. 10A) of the front display area 2111. According to an embodiment, for electrical connection between a printed circuit board (PCB) disposed at the first structure 210 at one end (e.g., upper end area or upper side) of the electronic device 200 and electronic components (e.g., antenna module, microphone module, speaker module, interface connector port, various sockets, or earjack assembly) disposed at the second structure 220 at the other end (e.g., lower end area or lower side) of the electronic device 200, the electronic device 200 may be configured so that an electrical connection member passes through a peripheral area (e.g., PA1 or PA2 of FIG. 11A) of the rear display. Thereby, the degree of freedom in mounting of electronic components in the electronic device is improved; thus, the design of the electronic device can be facilitated and the design thereof or a performance of each electronic component can be improved. In some embodiments, the rear display area 2112 may be formed to have a width equal to or greater than the width (e.g., the width L1 of FIG. 10A) of the front display area 2111.

Figure 12:
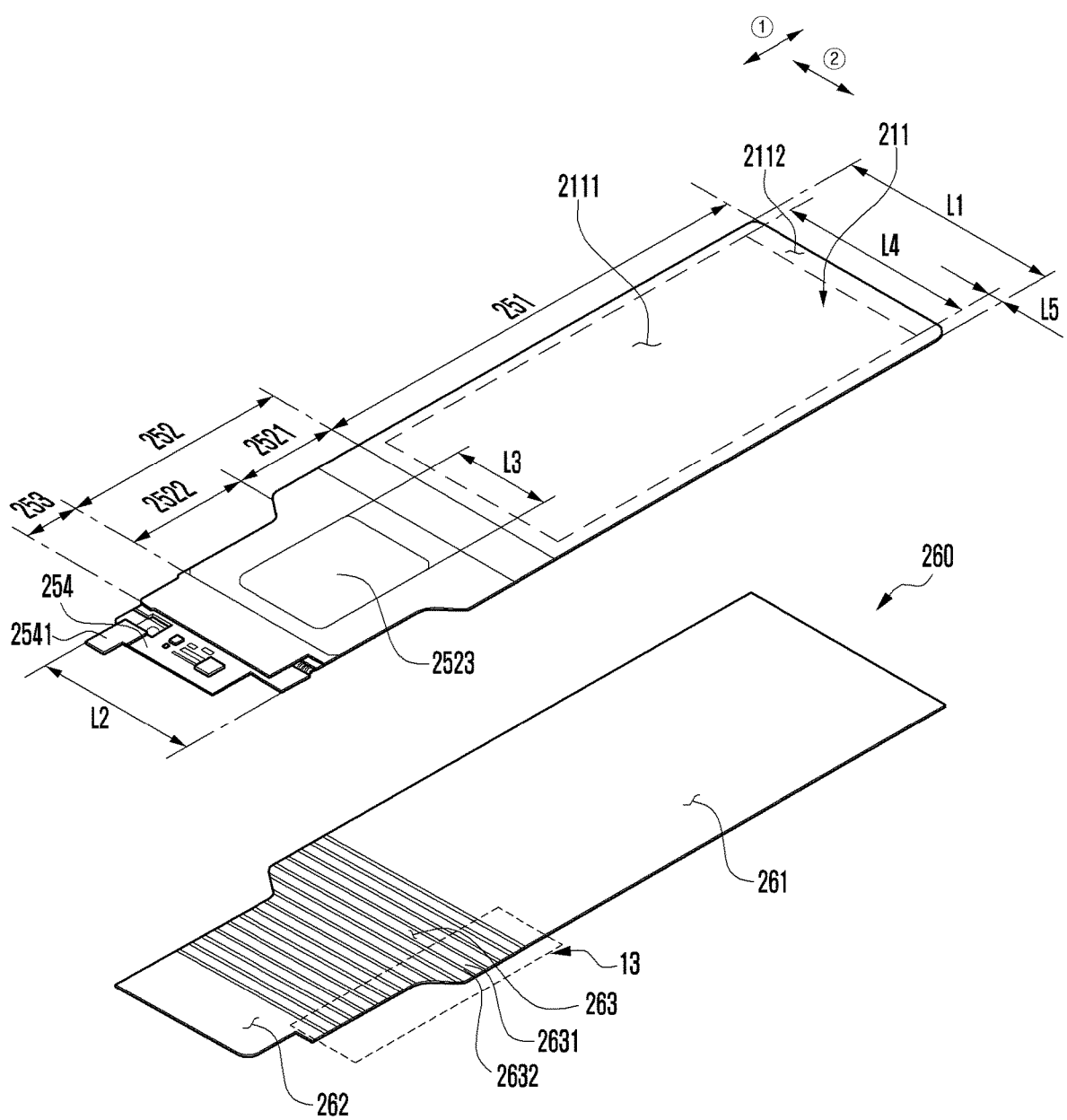
FIG. 12 is a diagram illustrating a configuration of a display according to an embodiment of the disclosure.

FIG. 12 is a diagram illustrating a configuration of a display according to an embodiment of the disclosure.

Referring to FIG. 12, the display 211 may include a first portion 251 having a first width L1, a second portion 252 extended from the first portion 251, and a third portion extended from the second portion and including a circuit portion 254. According to an embodiment, the second portion and the third portion may be received in an internal space of the electronic device. According to one embodiment, the second portion is a bendable portion and may include a first area 2521 extended from one end of the first portion 251 and having a width equal to the first width L1 and a second area 2522 extended from the first area 2521 and facing the rear surface (e.g., the rear surface 2002 of FIG. 11A) of the electronic device. According to an embodiment, the second area 2522 may have a second width L2 smaller than the first width L1 in a second direction (direction ②). According to an embodiment, a display area 2523 disposed in the second portion 252 may have a third width L3. According to an embodiment, the third width L3 may be formed to be smaller than the second width L2. According to one embodiment, the first portion 251 may include an active area 2111 having a fourth width L4 and an inactive area 2112 adjacent to the active area 2111 in a first direction (direction ①) and having a fifth width L5, and the second width L2 of the second area 2522 of the second portion 252 may be formed to be smaller than a fourth width L4 of the active area 2111. In some embodiments, the display area 2111 may be formed in a manner extended from the active area 2111 through the first area 2521. According to one embodiment, the circuit portion 254 (e.g., FPCB) including a connector 2541 may be attached to the second portion 252 of the display 211, and the second portion 252 of the display 211 may be electrically connected to the printed circuit board (not illustrated) of the electronic device 200.

According to various embodiments, the electronic device 200 may include a conductive plate 260 disposed beneath the display 211 and for supporting the display 211. According to one embodiment, the conductive plate 260 may include a first flat portion 261 corresponding to the first portion 251 of the display 211, a second flat portion 262 facing the third portion 253 of the display 211, and a flexible portion 263 (e.g., bendable portion) facing the second portion 252 of the display 211 and for connecting the first flat portion 261 and the second flat portion 262. According to an embodiment, the conductive plate 260 may be bent together with the display 211 through at least a portion of the flexible portion 263. According to an embodiment, when bending occurs in the second portion 252 of the display 211, at least a portion of the flexible portion 263 may be disposed to support the rear surface of the display 211.

According to various embodiments, the conductive plate 260 may include a plurality of support pieces 2631 (e.g., a plurality of support pieces 4531 of FIG. 5A) disposed between the first flat portion 261 and the second flat portion 262 and spaced by slits 2632 (e.g., the slits 4532 of FIG. 5A) at regular or irregular intervals. According to one embodiment, the plurality of support pieces 2631 may be spaced apart in a longitudinal direction (direction ①) of the conductive plate 260.

Figure 13A:
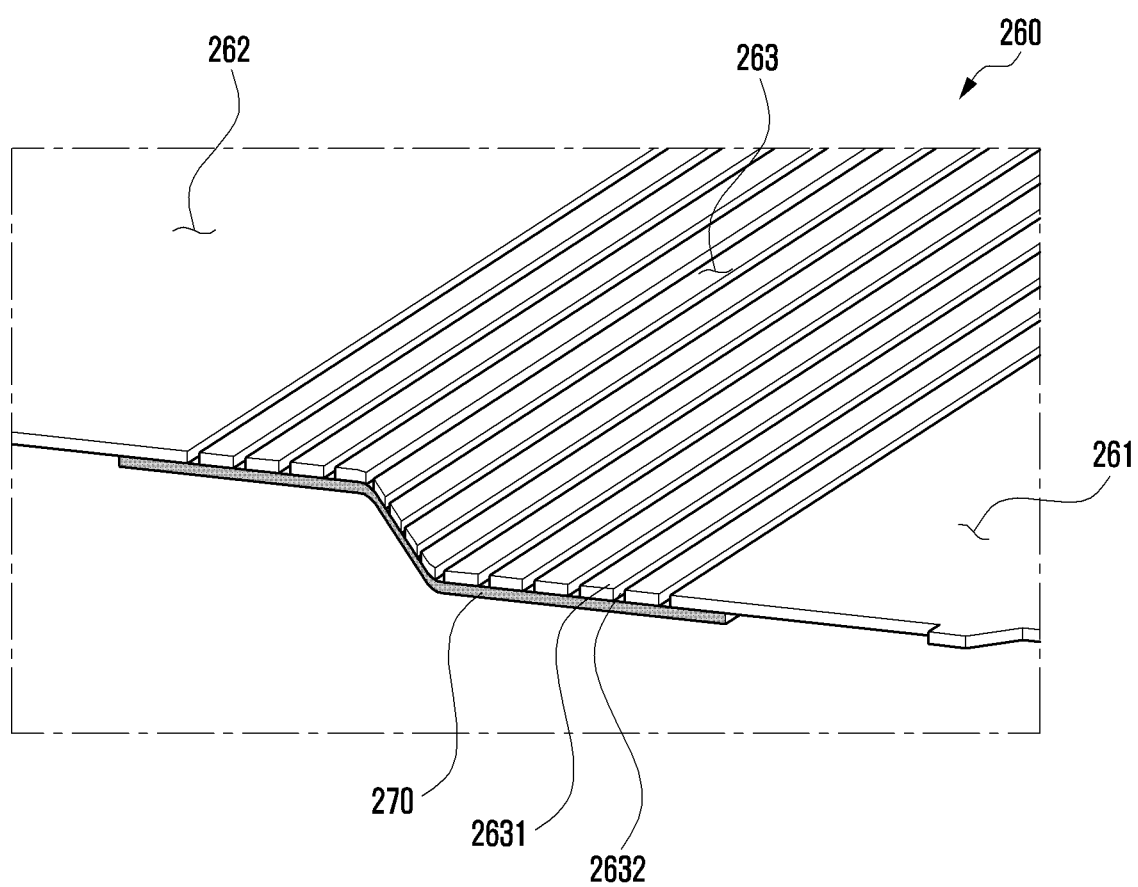
FIGS. 13A and 13B are enlarged views of an area 13 of FIG. 12 according to various embodiments of the disclosure.
Figure 13B:
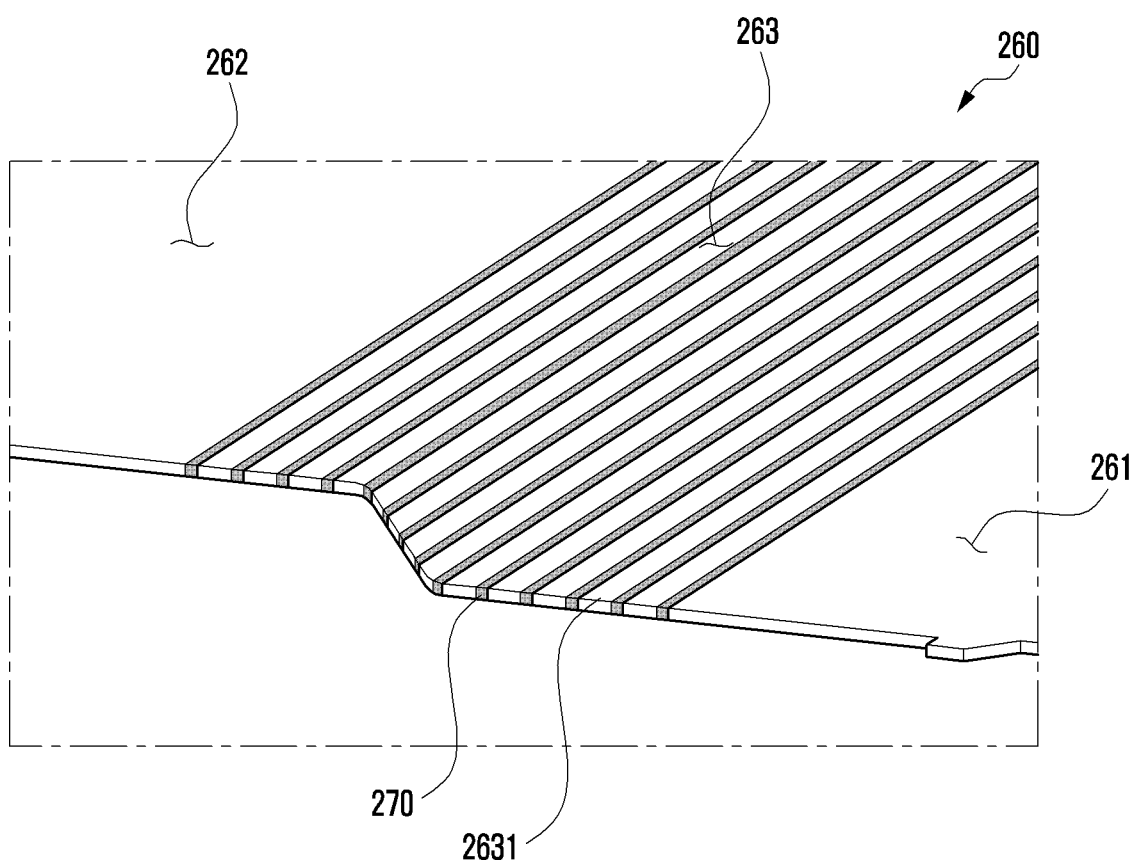

FIGS. 13A and 13B are enlarged views of an area 13 of FIG. 12 according to various embodiments of the disclosure.

Referring to FIGS. 13A and 13B, the conductive plate 260 may include a conductive elastic member 270 disposed to connect the plurality of support pieces 2631 of the flexible portion 263. According to one embodiment, the conductive elastic member 270 may include a conductive elastic tape member or a conductive elastic film member attached from a portion of the first flat portion 261 to at least one portion of the second flat portion 262 through the plurality of support pieces 2631 at a rear surface of the conductive plate 260. According to one embodiment, the conductive elastic tape member 270 may be formed with at least one of conductive rubber, conductive silicone, or conductive urethane. In some embodiments, the conductive elastic member 270 may include a conductive filling material filled in a plurality of slits 2632 and for connecting a plurality of peripheral support pieces 2631 to each other.

According to various embodiments, an electronic device (e.g., the electronic device 100 of FIG. 3) includes a hinge module (e.g., the hinge structure 164 of FIG. 3); a first housing (e.g., the first housing structure 110 of FIG. 3) connected to the hinge module; a second housing (e.g., the second housing structure 120 of FIG. 3) connected to the hinge module so as to fold the first housing; and a display (e.g., the display 400 of FIG. 4B) disposed to receive support of at least a portion of the second housing from at least a portion of the first housing through the hinge module, wherein the display includes a display panel (e.g., the display panel 430 of FIG. 4B); at least one polymer member (e.g., the polymer member 440 of FIG. 4A) disposed at a rear surface of the display panel; and a conductive plate (e.g., the conductive plate 450 of FIG. 4B) disposed at a rear surface of the polymer member, wherein the conductive plate includes a first flat portion (e.g., the first flat portion 451 of FIG. 4B) facing the first housing; a second flat portion (e.g., the second flat portion 452 of FIG. 4B) facing the second housing; and a flexible portion (e.g., the flexible portion 453 of FIG. 4B) configured to connect the first flat portion and the second flat portion and disposed to be bendable, wherein the flexible portion includes a plurality of support pieces (e.g., the support pieces 4531 of FIG. 5C) spaced apart from each other through a plurality of slits (e.g., the slits 4532 of FIG. 5C); and a conductive elastic member (e.g., the conductive elastic member 460 of FIG. 5C or the conductive elastic member 470 of FIG. 9A) configured to connect electrically and physically the first flat portion, the plurality of support pieces, and the second flat portion.

According to various embodiments, flexibility of the flexible portion may be determined by the conductive elastic member configured to connect the plurality of support pieces.

According to various embodiments, the plurality of support pieces may have a length in a first direction (e.g., y-direction of FIG. 7A) parallel to a folding axis (e.g., the folding axis A of FIG. 7A) and be disposed to be spaced apart at regular intervals through the plurality of slits in a second direction (e.g., x-direction of FIG. 7A) perpendicular to the first direction.

According to various embodiments, flexibility of the flexible portion may be determined by a width formed in each of the plurality of support pieces in the second direction.

According to various embodiments, the plurality of support pieces may be formed to gradually increase or decrease in width as they laterally progress based on the folding axis in the second direction.

According to various embodiments, flexibility of the flexible portion may be determined through a disposition density of the plurality of support pieces.

According to various embodiments, the plurality of support pieces may be formed to have a distance that gradually increases or decreases as they laterally progress based on the folding axis in the second direction.

According to various embodiments, flexibility of the flexible portion may be determined by different widths formed in each of the plurality of support pieces in the first direction.

According to various embodiments, flexibility of the flexible portion may be determined through at least one connection portion (e.g., the connection portion 4533 of FIG. 7C) in which at least some of the plurality of support pieces are connected in the second direction.

According to various embodiments, the flexible portion may further include a rigid reinforcement area (e.g., the rigid reinforcement area C2 of FIG. 7B) formed through a partial area of an upper end and a partial area of a lower end.

According to various embodiments, the flexible portion may be formed such that a first width (e.g., the first width w of FIG. 7B) of the plurality of support pieces in the rigid reinforcement area is greater than a second width (e.g., the second width w1 of FIG. 7B) of the plurality of support pieces in the other area.

According to various embodiments, the conductive plate may include a front surface facing the polymer member and a rear surface facing in a direction opposite to that of the front surface, and the conductive elastic member may be disposed to block the flexible portion at the rear surface of the conductive plate.

According to various embodiments, the conductive elastic member may include a conductive elastic tape member or a conductive elastic film member configured to connect the first flat portion, the second flat portion, and the plurality of support pieces at the rear surface of the conductive plate.

According to various embodiments, the conductive elastic member may be disposed between at least a portion of the first flat portion and the first housing, and between at least a portion of the second flat portion and the second housing at the rear surface of the conductive plate.

According to various embodiments, the electronic device may further include a step compensation member disposed in an area in which the conductive elastic member is not disposed between the first flat portion and the first housing and between the second flat portion and the second housing.

According to various embodiments, the conductive elastic member may be made of at least one of conductive rubber, conductive silicone, or conductive urethane.

According to various embodiments, the conductive elastic member may include a conductive elastic resin filled in the plurality of slits.

According to various embodiments, the conductive elastic resin may be filled and then cured in a liquid form in the plurality of slits.

According to various embodiments, the conductive elastic member may be formed to have an elongation rate of 1% or more.

According to various embodiments, the conductive plate may include at least one of Cu, Al, Mg, SUS, or clad in which the SUS and the Al are alternately disposed.

While the disclosure has been shown and described with reference to various embodiments thereof, it will be understood by those skilled in the art that various changes in form and details may be made therein without departing from the spirit and the scope of the disclosure as defined by the appended claims and their equivalents.

What is claimed is:
1. An electronic device, comprising:
a hinge;
a first housing connected to the hinge;
a second housing connected to the hinge so as to fold the first housing; and
a display disposed to receive support of at least a portion of the second housing from at least a portion of the first housing through the hinge,
wherein the display comprises:
a display panel,
at least one polymer member disposed at a rear surface of the display panel, and
a conductive plate disposed at a rear surface of the at least one polymer member,
wherein the conductive plate comprises:
a first flat portion facing the first housing,
a second flat portion facing the second housing, and
a flexible portion configured to connect the first flat portion and the second flat portion and disposed to be bendable,
wherein the flexible portion comprises:
a plurality of support pieces spaced apart from each other through a plurality of slits, and a conductive elastic member configured to connect electrically and physically the first flat portion, the plurality of support pieces, and the second flat portion, and wherein the conductive elastic member prevents introduction of foreign material into the conductive plate.

2. The electronic device of claim 1, wherein the conductive elastic member provides flexibility of the flexible portion.

3. The electronic device of claim 1, wherein the plurality of support pieces include a length in a first direction parallel to a folding axis and are disposed to be spaced apart at regular intervals through the plurality of slits in a second direction perpendicular to the first direction.

4. The electronic device of claim 3, wherein a width formed in each of the plurality of support pieces in the second direction provides flexibility of the flexible portion.

5. The electronic device of claim 4, wherein the plurality of support pieces are formed to gradually increase or decrease in width as they laterally progress based on the folding axis in the second direction.

6. The electronic device of claim 3, wherein a disposition density of the plurality of support pieces provides flexibility of the flexible portion.

7. The electronic device of claim 6, wherein the plurality of support pieces are formed to have a distance that gradually increases or decreases as they laterally progress based on the folding axis in the second direction.

8. The electronic device of claim 3, wherein different widths formed in each of the plurality of support pieces in the first direction provide flexibility of the flexible portion.

9. The electronic device of claim 3, wherein at least one connection portion in which one or more of the plurality of support pieces are connected in the second direction provides flexibility of the flexible portion.

10. The electronic device of claim 3, wherein the flexible portion comprises a rigid reinforcement area formed through a partial area of an upper end and a partial area of a lower end.

11. The electronic device of claim 10, wherein the flexible portion is formed based on a first width of the plurality of support pieces in the rigid reinforcement area being greater than a second width of the plurality of support pieces in another area.

12. The electronic device of claim 1, wherein the conductive plate comprises a front surface facing the at least one polymer member and a rear surface facing in a direction opposite to that of the front surface, and wherein the conductive elastic member is disposed to block the flexible portion at the rear surface of the conductive plate.

13. The electronic device of claim 12, wherein the conductive elastic member comprises at least one of a conductive elastic tape member or a conductive elastic film member configured to connect the first flat portion, the second flat portion, or the plurality of support pieces at the rear surface of the conductive plate.

14. The electronic device of claim 13, wherein the conductive elastic member is disposed between at least a portion of the first flat portion and the first housing, and between at least a portion of the second flat portion and the second housing at the rear surface of the conductive plate.

15. The electronic device of claim 14, further comprising:

a step compensation member disposed in an area in which the conductive elastic member is not disposed between the first flat portion and the first housing and between the second flat portion and the second housing.

16. The electronic device of claim 13, wherein the conductive elastic member comprises at least one of conductive rubber, conductive silicone, or conductive urethane.

17. The electronic device of claim 1, wherein the conductive elastic member comprises a conductive elastic resin filled in the plurality of slits.

18. The electronic device of claim 17, wherein the conductive elastic resin is filled and then cured in a liquid form in the plurality of slits.

19. The electronic device of claim 1, wherein the conductive elastic member is formed to have an elongation rate of 1% or more.

20. The electronic device of claim 1, wherein the conductive plate comprises at least one of Cu, Al, Mg, stainless steel (SUS), or CLAD, and wherein the CLAD comprises a stacked member in which the SUS and the Al are alternately disposed.

* * * * *